US010026457B2

United States Patent
Arai et al.

(10) Patent No.: US 10,026,457 B2
(45) Date of Patent: Jul. 17, 2018

(54) DEVICE HAVING MULTIPLE CHANNELS WITH CALIBRATION CIRCUIT SHARED BY MULTIPLE CHANNELS

(71) Applicant: Micron Technology, Inc., Boise, ID (US)

(72) Inventors: Tetsuya Arai, Tokyo (JP); Junki Taniguchi, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/490,690

(22) Filed: Apr. 18, 2017

(65) Prior Publication Data

US 2017/0221533 A1    Aug. 3, 2017

Related U.S. Application Data

(63) Continuation of application No. 14/695,837, filed on Apr. 24, 2015, now Pat. No. 9,666,245.

(30) Foreign Application Priority Data

May 21, 2014  (JP) ................. 2014-105195

(51) Int. Cl.
  *G11C 7/04* (2006.01)
  *H03K 19/0185* (2006.01)
(52) U.S. Cl.
  CPC ....... *G11C 7/04* (2013.01); *H03K 19/018507* (2013.01); *H03K 19/018585* (2013.01)

(58) Field of Classification Search
  None
  See application file for complete search history.

(56) References Cited

U.S. PATENT DOCUMENTS

| 2006/0158198 | A1 | 7/2006 | Fujisawa |
| 2008/0088338 | A1 | 4/2008 | Kim |
| 2011/0128038 | A1 | 6/2011 | Ko |
| 2012/0007631 | A1 | 1/2012 | Koo et al. |
| 2012/0056641 | A1 | 3/2012 | Kuroki et al. |
| 2012/0212254 | A1 | 8/2012 | Yokou et al. |
| 2013/0088257 | A1 | 4/2013 | Hara |
| 2015/0340069 | A1 | 11/2015 | Arai et al. |
| 2016/0012879 | A1 | 1/2016 | Eom et al. |
| 2016/0164521 | A1* | 6/2016 | Chung .......... H03K 19/017509 326/93 |

OTHER PUBLICATIONS

International Search Report and Written Opinion dated Jul. 16, 2015 received for Appln No. PCT/US2015/027607.

* cited by examiner

*Primary Examiner* — Jany Richardson
(74) *Attorney, Agent, or Firm* — Dorsey & Whitney LLP

(57) ABSTRACT

An apparatus includes a first channel, a second channel and a calibration circuit. The first channel includes a first command control circuit. The second channel includes a second command control circuit independent of the first command control circuit. The calibration circuit is shared by the first channel and the second channel to generate a calibration code responsive to a calibration command generated responsive to a first calibration command from the first command control circuit and a second calibration command from the second command control circuit.

16 Claims, 33 Drawing Sheets

| Reset object \ Reset request | PON | RESET | MRSVA | RSTA | RSTB |
|---|---|---|---|---|---|
| Arbiter 200 | ○ | ○ | ○ | × | × |
| Code generator 110 | ○ | ○ | ○ | × | × |
| Code register 121, 122 | ○ | ○ | × | × | × |
| Input register 301A, 302A | ○ | ○ | × | × | × |
| Default register 303A | ○ | ○ | ○ | ○ | × |
| Output register 304A | ○ | ○ | ○ | ○ | × |
| Input register 301B, 302B | ○ | ○ | × | × | × |
| Default register 303B | ○ | ○ | ○ | × | ○ |
| Output register 304B | ○ | ○ | ○ | × | ○ |

Fig. 12

| Timing Register | Initial | 1st to 2nd operation mode | Receive calibration command | Receive update command | Receive reset command | 2nd to 1st operation mode |
|---|---|---|---|---|---|---|
| | t61 | t62 | t63 | t64 | t65 | t66 |
| Code register 121 | DEFCODE1 | DEFCODE1 | DEFCODE1 | DEFCODE1 | DEFCODE1 | DEFCODE1 |
| Code register 122 | DEFCODE2 | DEFCODE2 | DEFCODE2 | DEFCODE2 | DEFCODE2 | DEFCODE2 |
| Code generator 110 | DEFCODE1 | DEFCODE1 | CALCODE | CALCODE | DEFCODE1 | DEFCODE1 |
| Input register 301A, 301B | DEFCODE1 | DEFCODE1 | CALCODE | CALCODE | DEFCODE1 | DEFCODE1 |
| Input register 302A, 302B | DEFCODE1 | DEFCODE2 | DEFCODE2 | CALCODE | CALCODE | CALCODE |
| Default register 303A, 303B | DEFCODE1 | DEFCODE2 | DEFCODE2 | DEFCODE2 | DEFCODE2 | DEFCODE1 |
| Output register 304A, 304B | DEFCODE1 | DEFCODE1 | DEFCODE2 | CALCODE | DEFCODE2 | DEFCODE1 |

Calibration circuit 100: Code register 121, Code register 122, Code generator 110

Relay circuit 300A, 300B: Input register 301A, 301B, Input register 302A, 302B, Default register 303A, 303B, Output register 304A, 304B

DEVICE HAVING MULTIPLE CHANNELS WITH CALIBRATION CIRCUIT SHARED BY MULTIPLE CHANNELS

This application is a continuation of U.S. application Ser. No. 14/695,837, filed Apr. 24, 2015, U.S. Pat. No. 9,666,245 issued on May 30, 2017, which is based upon and claims the benefit of priority from Japanese patent application No. 2014-105195 filed on May 31, 2014. These applications and patent are incorporated by reference herein in their entirety and for all purposes.

BACKGROUND

Field of the Invention

This invention relates to a semiconductor device, in particular, a semiconductor device that has calibration circuit adjusting impedance of data output circuit.

Description of the Related Art

A semiconductor device such as a DRAM (Dynamic Random Access Memory) is provided with a data output circuit for outputting data to outside. The data output circuit is designed so as to obtain desired impedance when activated. However, due to the influence from process variations, temperature changes, etc., the impedance as designed is not always obtained. Therefore, in a semiconductor device in which the impedance of a data output circuit has to be controlled with high accuracy, an impedance adjustment circuit called a calibration circuit is built (see Patent Documents 1, 2).

Incidentally, recently, a semiconductor device of a type that it is divided into a plurality of channels has been proposed. The channels are circuit blocks which can be independently accessed, and each of the channels is provided with a memory cell array, an access control circuit, external terminals, etc. Basically all circuits are separated among the channels, the channels are operated in synchronization with mutually different clock signals, and mutually different external terminals are used also for reception of command/address signals and input/output or data. Thus, each of the channels can be considered as an independent single semiconductor device and, regarding this point, is distinguished from an access unit called a bank.

[Patent document 1] Japanese Laid-Open Patent Publication No. 2011-119632 (English equivalent U.S. Pat. Pub. No. 2011-0128038)

[Patent document 2] Japanese Laid-Open Patent Publication No. 2006-203405 (English equivalent U.S. Pat. Pub. No. 2006-0158198)

SUMMARY

In one embodiment, there is provided an apparatus that includes a first channel, a second channel and a calibration circuit. The first channel includes a first command control circuit, a first memory cell array configured to be controlled by the first command control circuit and a first data output circuit configured to output first data from the first memory cell array with first impedance controlled responsive to a first calibration code. The second channel is provided independently of the first channel and includes a second command control circuit, a second memory cell array configured to be controlled by the second command control circuit and a second data output circuit configured to output second data from the second memory cell array with second impedance controlled responsive to a second calibration code. The calibration circuit is configured to provide the first calibration code responsive to a first calibration control signal from the first command control circuit and the second calibration code responsive to a second calibration control signal from the second command control circuit.

In another embodiment, there is provided an apparatus that includes a controller and a first memory device. The controller includes a first core comprising a first command terminal and a first data terminal and a second core comprising a second command terminal and a second data terminal. The first core and the second core are configured to issue a first calibration command to the first command terminal and a second calibration command to the second command terminal independently of each other. The first memory device includes a first channel, a second channel and a calibration circuit. The first channel includes a third command terminal coupled to the first command terminal, a third data terminal coupled to the first data terminal and a first data output circuit coupled to the third data terminal. The second channel includes a fourth command terminal coupled to the second command terminal, a fourth data terminal coupled to the second data terminal and a second data output circuit coupled to the fourth data terminal. The calibration circuit is configured to provide a calibration code responsive to each of the first calibration command and the second calibration command.

In still another embodiment, there is provided an apparatus that includes a calibration circuit configured to generate a calibration code responsive to a command signal and an arbiter configured to be supplied with a first calibration command and a second calibration command independently of each other and arbitrate the first calibration command and the second calibration command to provide the command signal.

BRIEF DESCRIPTION OF THE DRAWINGS

FIG. 12 is a table for explaining the relation between the types of reset requests and circuit blocks serving as reset objects in the calibration circuit;

FIG. 30 is a drawing showing an example of changes of adjustment codes retained in registers;

DETAILED DESCRIPTION OF THE EMBODIMENTS

Hereinafter, a preferred embodiment of the present invention will be explained in detail with reference to accompanying drawings.

Figure 1:
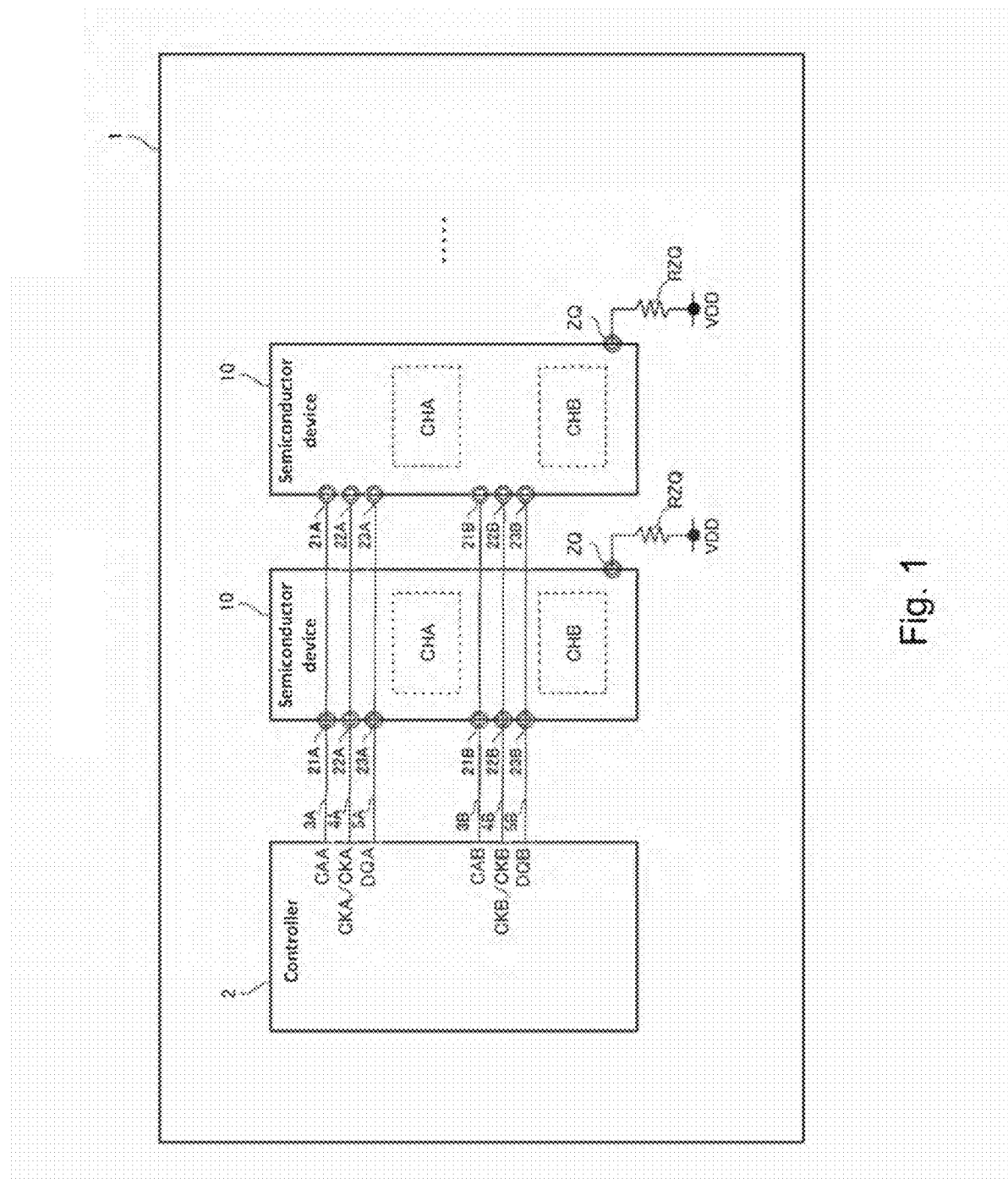
FIG. 1 is a block diagram of an overall configuration of a semiconductor device according to an embodiment of the present invention.

FIG. 1 is a block diagram showing a configuration of a system 1 provided with semiconductor devices 10 according to the preferred embodiment of the present invention.

Even a semiconductor device which is provided with a plurality of channels can employ a configuration in which part of the circuits such as a calibration circuit is shared. In this case, since it is conceivable that calibration commands which are issued to the respective channels compete with one another, the manner of operating the shared calibration circuit has to be studied.

The system 1 shown in FIG. 1 is provided with the plurality of semiconductor devices 10 and a controller 2, which controls them. Each of the semiconductor devices 10 is not particularly limited to, but is a LPDDR4 (Low Power Double Data Rate 4) type DRAM integrated on a single semiconductor chip. Each of the semiconductor devices 10 is provided with two channels CHA and CHB to which mutually different external terminals are allocated. The channel CHA carries out read operations and write operations based on command/address signals CAA and external clock signals CKA and /CKA supplied from a first core portion of the controller 2, and the channel CHB carries out read operations and write operations based on command/address signals CAB and external clock signals CKB and /CKB supplied from a second core portion of the controller 2.

The command address signals CAA and the external clock signals CKA and /CKA are commonly supplied to command/address terminals 21A and clock terminals 22A of the plurality of semiconductor devices 10 via a command/address bus 3A and a clock bus 4A, respectively. The command/address signals CAA and the external clock signals CKA and /CKA are supplied to the channels CHA, thereby carrying out access operations with respect to memory cell arrays contained in the channels CHA.

The command/address signals CAB and the external clock signals CKB and /CKB are commonly supplied to command/address terminals 21B and clock terminals 22B of the plurality of semiconductor devices 10 via a command/address bus 3B and a clock bus 4B, respectively. The command/address signals CAB and the external clock signals CKB and /CKB are supplied to the channels CHB, thereby carrying out access operations with respect to memory cell arrays contained in the channels CHB.

However, among the command/address signals CAA and CAB, some of the signals such as chip select signals are individually supplied to one, two, or more of the semiconductor devices 10.

Read data DQA read from the channels CHA of the semiconductor devices 10 is output via data terminals 23A. The data terminals 23A are connected to a data bus 5A, thereby transferring the read data DQA, which has been read from the channels CHA, to the controller 2. Reversely, write data DQA to be written to the channels CHA is input from the controller 2 via a data bus 5A.

The read data DQB read from the channels CHB of the semiconductor devices 10 is output via data terminals 23B. The data terminals 23B are connected to a data bus 5B, thereby transferring the read data DQB, which has been read from the channels CHB, to the controller 2. Reversely, write data DQB to be written to the channels CHB is input from the controller 2 to the data terminals 23B via the data bus 5B.

Note that the semiconductor device in the present invention is not required to be a semiconductor device which is able to carry out input of data (write operations), but may be able to carry out only output of data (read operations) like a ROM-based semi-conductor device.

The semiconductor devices 10 are provided with calibration terminals ZQ. Only the single calibration terminal ZQ is provided on each of the semiconductor devices 10 and is therefore shared by the channels CHA and CHB. The calibration terminal ZQ is connected to a power-source potential VDD via a reference resistor RZQ provided on a memory module substrate or a motherboard. The reference resistor RZQ is a resistance referenced in a later-described calibration operation. Note that, in the present specification, the resistance value of the reference resistor RZQ is also described as "RZQ" in some cases. The resistance values of other elements or circuits are also described as "RZQ" as long as they are the same resistance values as the resistance value of the reference resistor RZQ.

Figure 2:
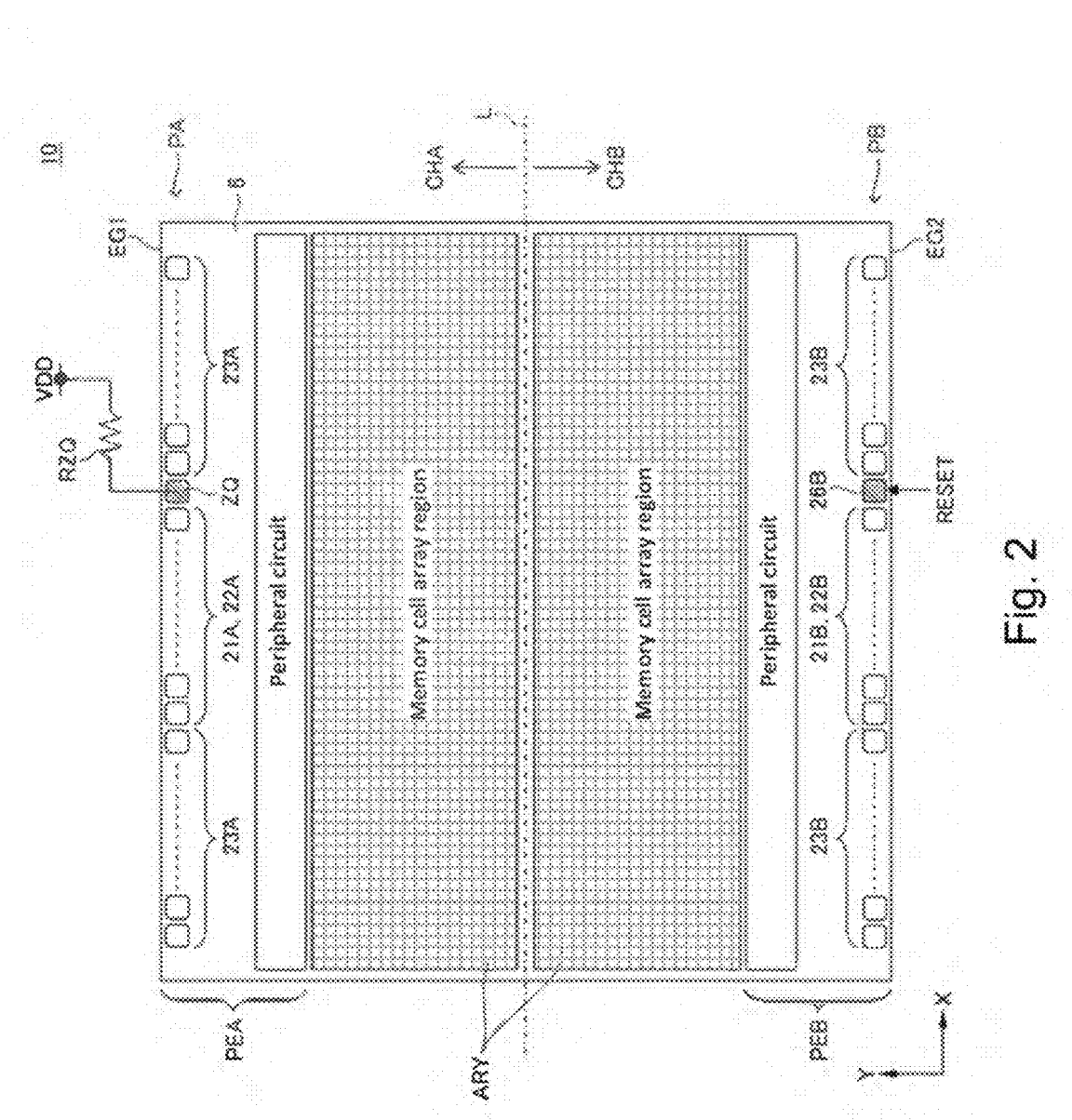
FIG. 2 is a schematic plan view for explaining a layout of a semiconductor device 10.

FIG. 2 is a schematic plan view for explaining a layout of the semiconductor device 10.

As shown in FIG. 2, the semiconductor device 10 is integrated on a substrate 6, which has a rectangular planar shape, and the channels CHA and CHB are disposed by using a boundary line L, which divides the substrate 6 in a Y-direction, as a boundary. The substrate 6 has a first peripheral region PEA provided along an edge EG1 in a first side in the Y-direction, a second peripheral region PEB provided along an edge EG2 in a second side in the Y-direction, and memory cell array regions ARY provided so as to be sandwiched therebetween.

The external terminals and peripheral circuits belonging to the channel CHA are disposed in the first peripheral region PEA, and the external terminals and peripheral circuits belonging to the channel CHB are disposed in the second peripheral region PEB. The memory cell arrays contained in the channels CHA and CHB are disposed in the memory cell array regions ARY.

The external terminals belonging to the channel CHA include the command/address terminals 21A, the clock terminals 22A, and the data terminals 23A described above, and these are arranged in a pad queue PA extending in an X-direction. Similarly, the external terminals belonging to the channel CHB include the command/address terminals 21B, the clock terminals 22B, and the data terminals 23B described above, and these are arranged in a pad queue PB extending in the X-direction.

Furthermore, the pad queue PA provided in the first peripheral region PEA includes the calibration terminal ZQ. The calibration terminal ZQ is shared by the channels CHA and CHB. On the other hand, the pad queue PB provided in the second peripheral region PEB includes a reset terminal 26B. The reset terminal 26B is a terminal to which a reset signal RESET is input from the controller 2 and is shared by the channels CHA and CHB.

Figure 3:
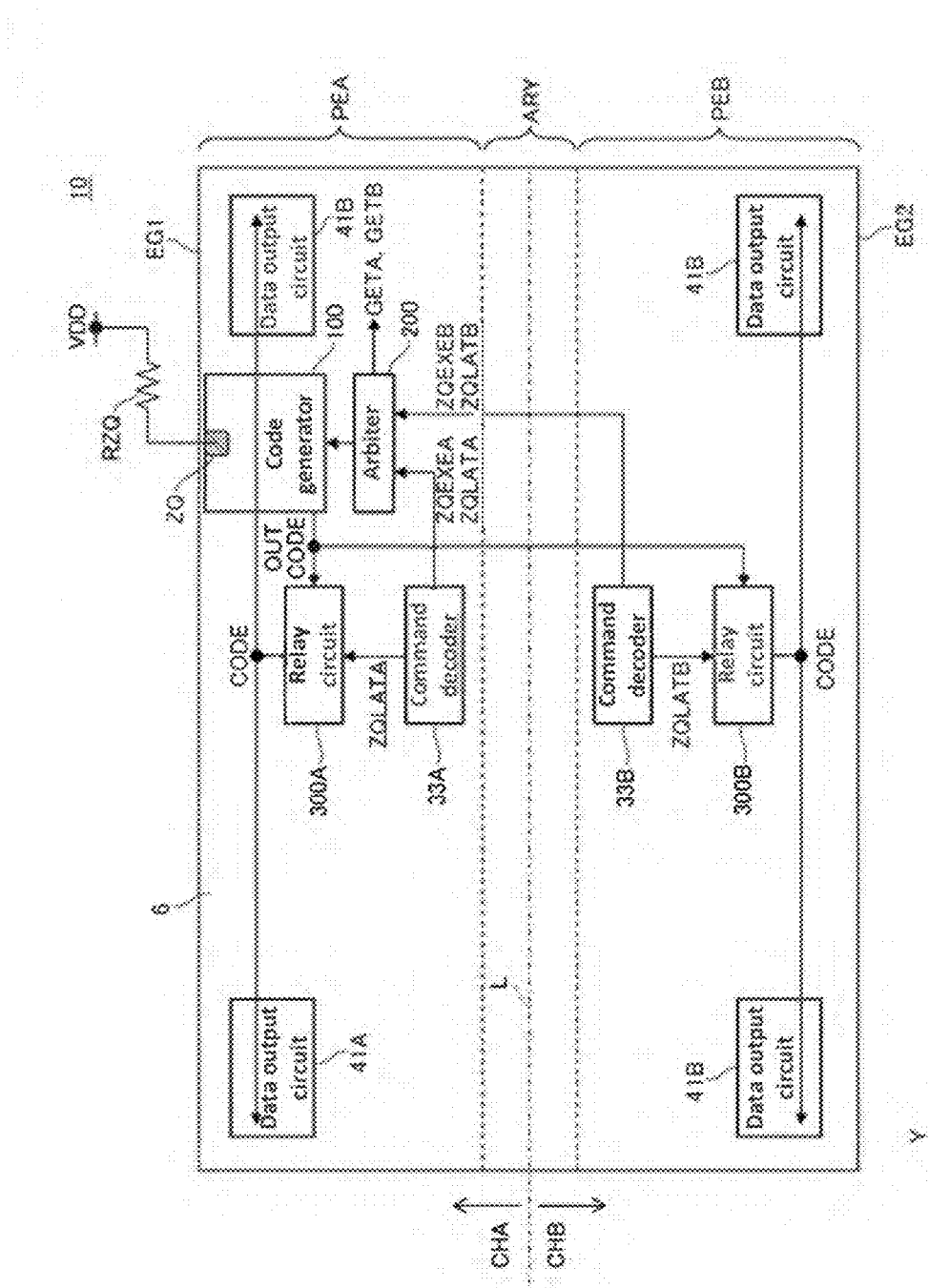
FIG. 3 is a schematic plan view for explaining a layout of a calibration circuit.

FIG. 3 is a schematic plan view for explaining a layout of a calibration circuit.

As shown in FIG. 3, the calibration circuit includes a code generator 100, an arbiter 200, and two relay circuits 300A and 300B. Among them, the code generator 100, the arbiter 200, and the relay circuit 300A are disposed in the first peripheral region PEA, and the relay circuit 300B is disposed in the second peripheral region PEB.

The code generator 100 is a circuit which generates an adjustment code OUTCODE by referencing the voltage of the calibration terminal ZQ, and the operation thereof is controlled by the arbiter 200. The arbiter 200 receives a calibration execution signal ZQEXEA and a code update signal ZQLATA supplied from a command decoder 33A, receives a calibration execution signal ZQEXEB and a code update signal ZQLATB supplied from a command decoder 33B, and controls the operation of the code generator 100 based on them. Details of the code generator 100 and the arbiter 200 will be described later.

The adjustment code OUTCODE generated by the code generator 100 is transferred to and retained by relay circuits 300A and 300B. Then, the adjustment codes CODE retained by the relay circuits 300A and 300B are supplied to data output circuits 41A and 41B, respectively, thereby adjusting the output impedance of the data output circuits 41A and 41B.

Herein, one of the reason why the adjustment code OUTCODE output from the code generator 100 is supplied via the relay circuits 300A and 300B instead of directly supplying the adjustment code OUTCODE to the data output circuits 41A and 41B is that the distance between the code generator 100 and the data output circuit 41B is long. More specifically, while the code generator 100 is disposed in the first peripheral region PEA, which is close to the edge EG1 of the substrate 6, the data output circuit 41B is disposed in the second peripheral region PEB, which is close to the edge EG2 of the substrate 6; therefore, the line length of the line connecting them becomes a long-distance line having a length close to the length of the substrate 6 in the Y-direction. Therefore, if the code generator 100 and the data output circuit 41B are directly connected to each other, every time the value of the adjustment code OUTCODE (later-described CALCODE) is changed during a calibration operation, the long-distance line is charged/discharged; and, therefore, consumed current is increased. In order to prevent this, the present embodiment is configured to transfer the value-determined adjustment code OUTCODE (CALCODE) from the code generator 100 to the relay circuits 300A and 300B after the calibration operation is completed and adjust the output impedance of the data output circuits 41A and 41B based on the adjustment codes CODE retained in the relay circuits 300A and 300B.

Figure 4:
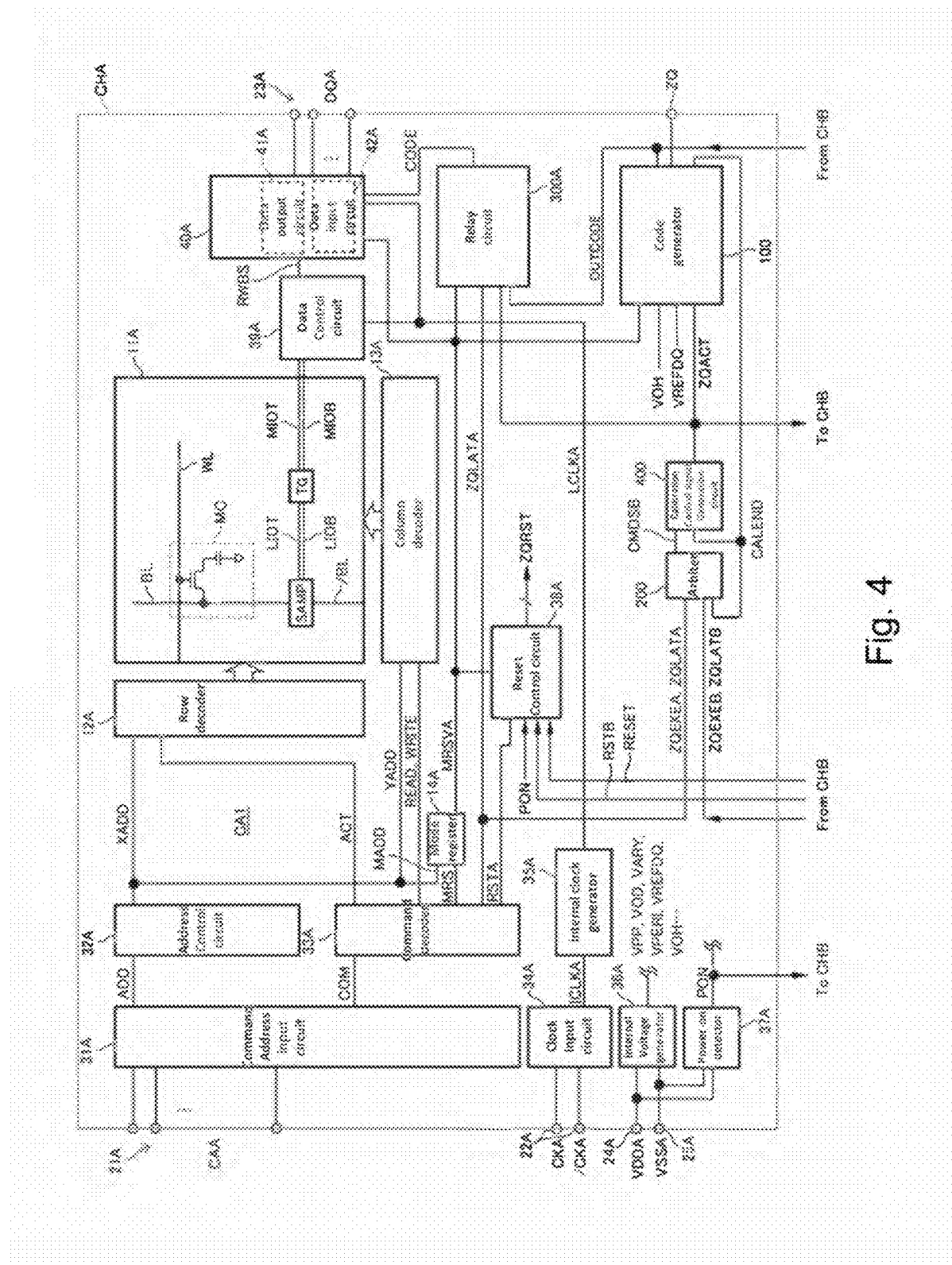
FIG. 4 is a block diagram showing a configuration of a channel CHA.

FIG. 4 is a block diagram showing a configuration of the channel CHA.

As shown in FIG. 4, the channel CHA has a memory cell array 11A. The memory cell array 11A is provided with a plurality of word lines WL and a plurality of bit lines BL and /BL and has a configuration in which memory cells MC are disposed at intersection points thereof. Selection of the word lines WL is carried out by a row decoder 12A, and selection of the bit lines BL and /BL is carried out by a column decoder 13A.

The bit lines BL and /BL forming pairs are connected to a sense amplifier SAMP provided in the memory cell array 11A. The sense amplifier SAMP amplifies the voltage difference generated between the bit lines BL and /BL and supplies the read data, which has been obtained as a result thereof, to complementary IO lines LIOT/LIOB. The read data supplied to the local IO lines LIOT/LIOB is transferred to complementary main IO lines MIOT/MIOB via a switch circuit TG. Then, the read data on the main IO lines MIOT/MIOB is converted to single-ended signals by a data control circuit 39A and is supplied to a data input/output circuit 40A via a read/write bus RWBS. The data input/output circuit 40A includes the data output circuit 41A and a data input circuit 42A.

The channel CHA is provided with the command/address terminals 21A, the clock terminals 22A, the data terminals 23A, voltage terminals 24A and 25A, and the calibration terminal ZQ as the external terminals.

The command/address signals CAA are input from outside to the command/address terminals 21A. The command/address signals CAA input to the command/address terminals 21A are supplied to a command/address input circuit 31A. The command/address signals CAA include address signals ADD and command signals COM. Among them, the address signals ADD are supplied to an address control circuit 32A, and the command signals COM are supplied to the command decoder 33A. Circuit blocks such as the command/address input circuit 31A, the address control circuit 32A, the command decoder 33A, the row decoder 12A, and the column decoder 13A which access the memory cell array 11A constitute a first command/address control circuit CA1.

Among the address signals ADD, the address control circuit 32A supplies row addresses XADD thereof to the row decoder 12A and supplies column addresses YADD thereof to the column decoder 13A. If there is an entry in a mode register set, a mode signal MADD is supplied to a mode register 14A.

The mode register 14A is a circuit in which a parameter representing an operation mode of the channel CHA is set. The mode signals output from the mode register 14A include an output-level select signal MRSVA. The output-level select signal MRSVA is supplied to the data input/output circuit 40A. The output-level select signal MRSVA is a signal for selecting the output level of the read data DQA.

The command decoder 33A is a circuit which generates various internal commands by decoding the command signals COM. Examples of the internal commands include active signals ACT, read signals READ, write signals WRITE, mode-register-set signals MRS, the calibration execution signals ZQEXEA, the code update signals ZQLATA, and reset signals RSTA.

The active signal ACT is a signal which is activated if the command signal COM is representing row access (active command). When the active signal ACT is activated, the row address XADD latched in the address control circuit 32A is supplied to the row decoder 12A. As a result, the word line WL specified by the row address XADD is selected.

The read signal READ and the write signal WRITE are the signals which are activated if the command signals COM are representing a read command and a write command. When the read signal READ or the write signal WRITE is activated, the column address YADD latched in the address control circuit 32A is supplied to the column decoder 13A. As a result, the bit line BL or /BL specified by the column address YADD is selected.

Therefore, if an active command and a read command are input, and the row address XADD and the column address YADD are input in synchronization with them; as a result, the read data DQA is read from the memory cell MC specified by the row address XADD and the column address YADD. The read data DQA is output from the data terminal 23A to outside via the data control circuit 39A and the data output circuit 41A, which is contained in the data input/output circuit 40A.

On the other hand, if an active command and a write command are input, the row address XADD and the column address YADD are input in synchronization with them, and, then, the write data DQA is input to the data terminal 23A; as a result, the write data DQA is supplied to the memory cell array 11A via the data input circuit 42A, which is contained in the data input/output circuit 40A, and the data control circuit 39A and is written to the memory cell MC, which is specified by the row address XADD and the column address YADD.

The mode-register-set signal MRS is a signal which is activated if the command signal COM is representing a mode-register-set command. Therefore, if the mode-register-set command is input, and the mode signal MADD is input from the command/address terminal 21A in synchronization with that; as a result, the set value of the mode register 14A can be rewritten.

The calibration execution signal ZQEXEA is a signal which is activated if the command signal COM is representing a calibration command. When the calibration execution signal ZQEXEA is activated, the code generator 100 executes a calibration operation, thereby generating the adjustment code OUTCODE. The adjustment code OUTCODE generated by the code generator 100 is transferred to the relay circuits 300A and 300B after the calibration operation is terminated.

The code update signal ZQLATA is a signal which is activated if the command signal COM is representing a code update command. When the code update signal ZQLATA is activated, an adjustment code CODE retained by the relay circuit 300A is supplied to the data input/output circuit 40A. As a result, the output impedance of the data output circuit 41A, which is contained in the data input/output circuit 40A, is changed in accordance with the adjustment code CODE.

The reset signal RSTA is a signal which is activated if the command signal COM is representing a reset command. The reset signal RSTA is input to a reset control circuit 38A. Based on various reset requests in the semiconductor device 10, the reset control circuit 38A controls the states of the corresponding circuit blocks. Examples of the reset requests include reset signals RSTB and RESET, which are supplied from the channel CHB, and power-on reset signals PON, in addition to the above described reset signals RSTA. The output-level select signal MRSVA is also input to the reset control circuit 38A.

The external clock signals CKA and /CKA are input to the clock terminals 22A. The external clock signal CKA and the external clock signal /CKA are mutually complementary signals, and both of them are supplied to a clock input circuit 34A. The clock input circuit 34A receives the external clock signals CKA and /CKA and generates an internal clock signal ICLKA. The internal clock signal ICLKA is used as a timing signal which defines the operation timing of the circuit blocks contained in the channel CHA such as the address control circuit 32A and the command decoder 33A.

The internal clock signal ICLKA is also supplied to an internal clock generator 35A, and, as a result, a phase-controlled internal clock signal LCLKA is generated. A DLL circuit can be used as the internal clock generator 35A, but it is not particularly limited thereto. The internal clock signal LCLKA is supplied to the data input/output circuit 40A and is used as a timing signal for determining output timing of the read data DQA.

The voltage terminals 24A and 25A are the terminals to which power-source potentials VDDA and VSSA are supplied. The power-source potentials VDDA and VSSA supplied to the voltage terminals 24A and 25A are supplied to an internal voltage generator 36A. The internal voltage generator 36A generates various internal potentials VPP, VOD, VARY, and VPERI and reference potentials ZQVREF and VOH based on the power-source potentials VDDA and VSSA. The internal potential VPP is a potential which is mainly used in the row decoder 12A, the internal potentials VOD and VARY are potentials which are used in the sense amplifier SAMP, and the internal potential VPERI is a potential which is used in many other circuit blocks. On the other hand, the reference potentials ZQVREF and VOH are reference potentials which are used in the code generator 100.

The voltage terminals 24A and 25A are also connected to the power-on detector 37A. The power-on detector 37A is a circuit which detects that power is turned on for the voltage terminals 24A and 25A and, when power-on is detected, activates the power-on reset signal PON. The power-on reset signal PON is supplied to the circuit blocks of the channels CHA and CHB and resets the circuits thereof.

The calibration terminal ZQ is connected to the code generator 100. When activated by a calibration-state signal ZQACT, the code generator 100 references the impedance of the reference resistor RZQ and the reference potentials ZQVREF and VOH and carries out a calibration operation. The adjustment code OUTCODE obtained by the calibration operation is supplied to the data input/output circuit 40A, and, as a result, the output impedance of the data output circuit 41A contained in the data input/output circuit 40A is specified. When the calibration operation is terminated, a calibration end signal CALEND is output from the code generator 100.

The calibration control signal ZQACT is generated by a calibration control signal generation circuit 400. Although details will be described later, the calibration control signal generation circuit 400 activates the calibration control signal ZQACT in response to a calibration start signal CMDSB supplied from the arbiter 200 and deactivates the calibration control signal ZQACT in response to the calibration end signal CALEND supplied from the code generator 100.

The arbiter 200 receives the calibration execution signal ZQEXEA, the code update signal ZQLATA, and the calibration execution signal ZQEXEB and the code update signal ZQLATB supplied from the channel CHB and generates the calibration start signal CMDSB based on them. Details of the arbiter 200 will be described later.

Figure 5:
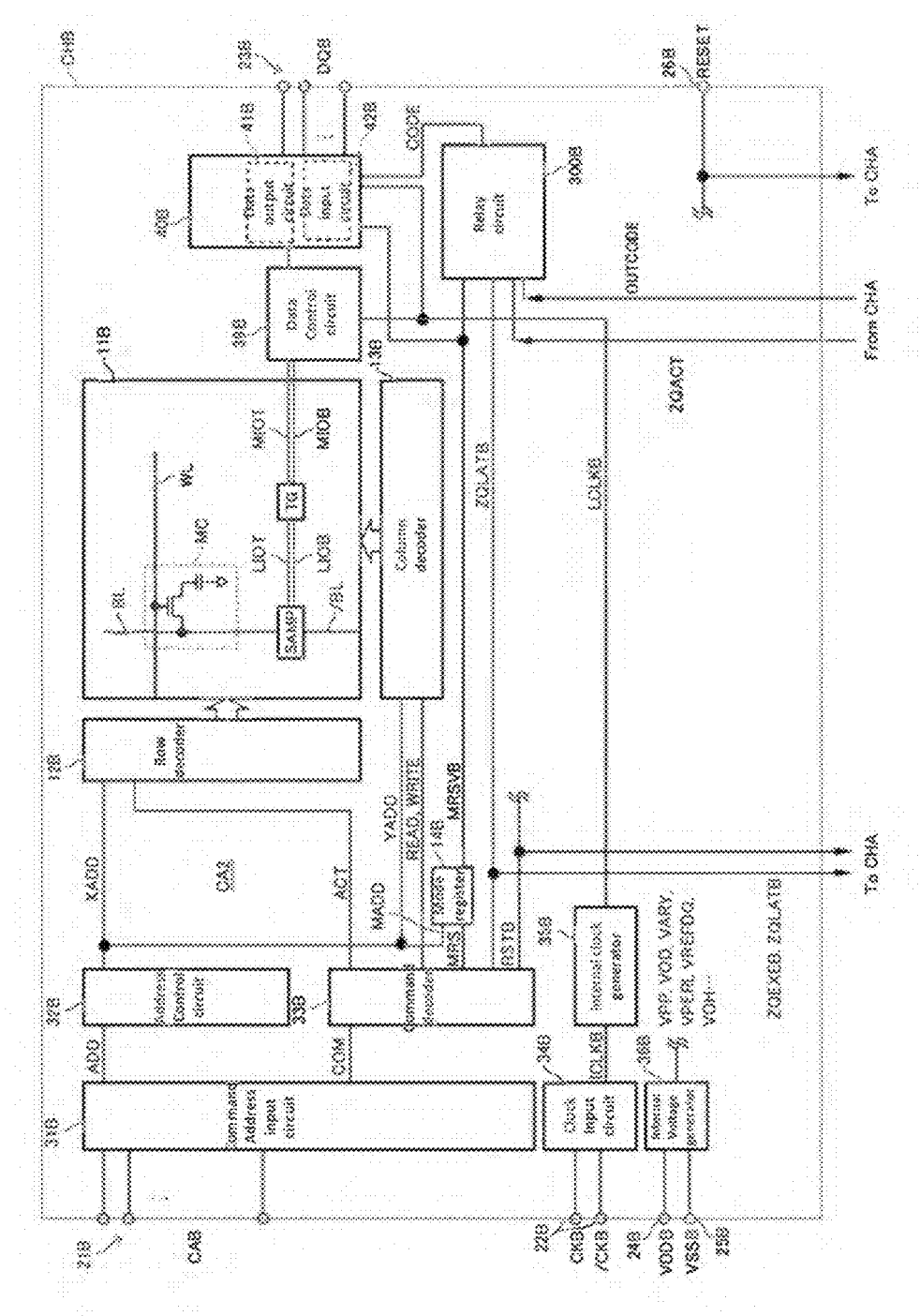
FIG. 5 is a block diagram showing a configuration of a channel CHB.

FIG. 5 is a block diagram showing a configuration of the channel CHB.

As shown in FIG. 5, the channel CHB has a circuit configuration similar to that of the channel CHA shown in FIG. 4 except for the point that some circuit blocks are added or deleted. The symbols of the circuit blocks shown in FIG. 5 are denoted with "B" at the ends thereof. These circuit blocks correspond to the corresponding circuit blocks denoted with "A" at the ends thereof among the circuit blocks shown in FIG. 4. The circuit blocks such as a command/address input circuit 31B, an address control circuit 32B, the command decoder 33B, a row decoder 12B, and a column decoder 13B which access a memory cell array 11B constitute a second command/address control circuit CA2.

Since the basic functions and connection relations of the circuit blocks constituting the channel CHB are the same as those of the channel CHA shown in FIG. 4, redundant explanations are omitted, and the parts different from the channel CHA will be focused on and explained.

In a region of the channel CHB, the circuit blocks corresponding to the power-on detector 37A, the reset control circuit 38A, the code generator 100, and the arbiter 200 are not provided. The circuits are provided in a region of the channel CHA and shared with the channel CHB. Instead, the channel CHB is provided with the reset terminal 26B to which the reset signal RESET is input. The reset signal RESET is supplied to the reset control circuit 38A contained in the channel CHA. The adjustment code OUTCODE is transferred from the code generator 100 to the relay circuit 300B.

Power-source potentials VDDB and VSSB are supplied to voltage terminals 24B and 25B belonging to the channel CHB, respectively. The power-source potential VDDA and the power-source potential VDDB are the same potentials and are simply described as VDD when they are not particularly required to be distinguished from each other. Similarly, the power-source potential VSSA and the power-source potential VSSB are the same potentials and are simply described as VSS when they are not particularly required to be distinguished from each other.

Figure 6:
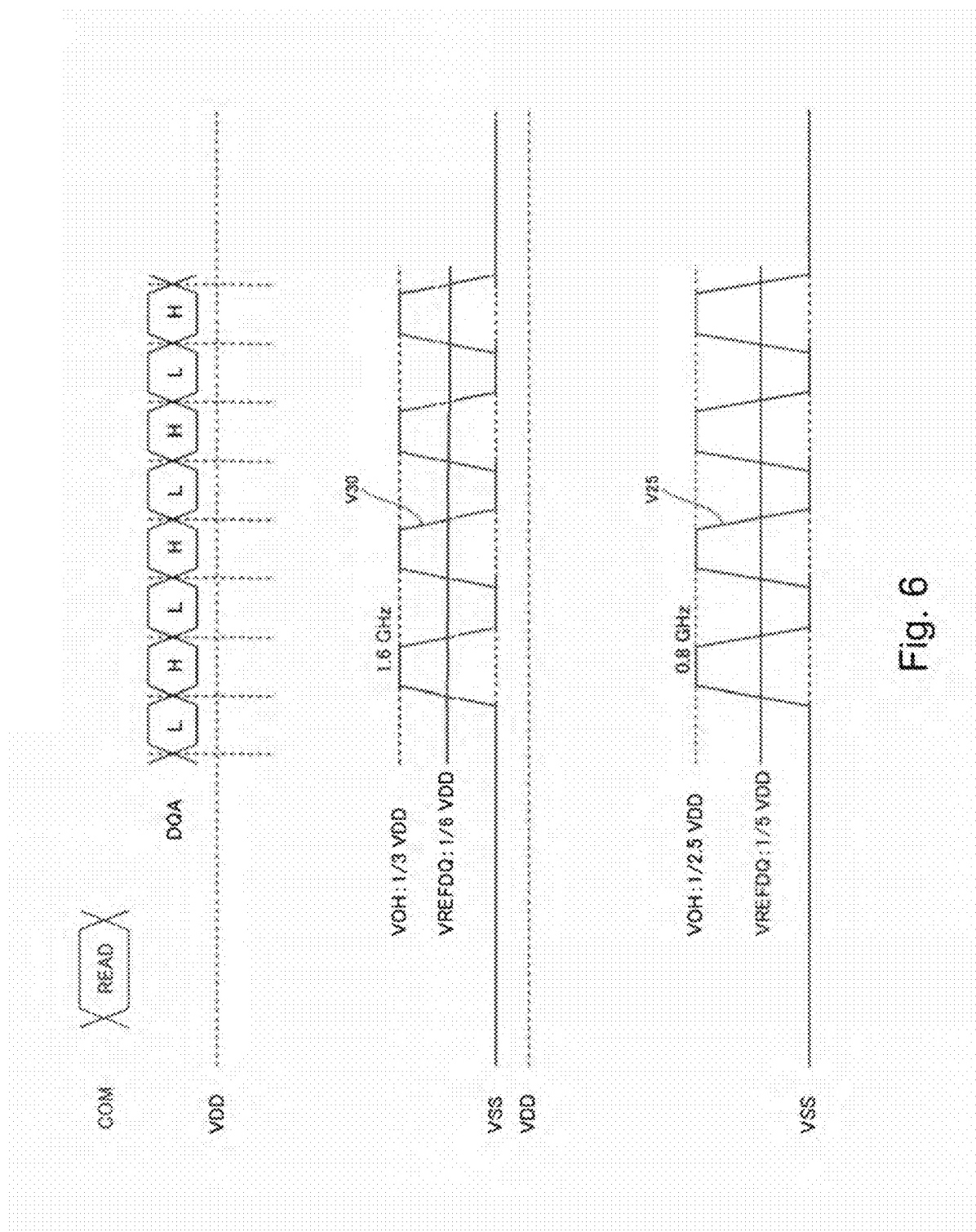
FIG. 6 is a drawing for explaining differences in the waveforms of read data DQA depending on operation modes; wherein, a symbol V30 represents the waveform of the read data DQA in a case in which a first operation mode is specified, and a symbol V25 represents the waveform of the read data DQA in a case in which a second operation mode is specified.

FIG. 6 is a drawing for explaining differences in the waveforms of the read data DQA depending on operation modes; wherein, a symbol V30 represents the waveform of the read data DQA in a case in which a first operation mode is specified, and a symbol V25 represents the waveform of the read data DQA in a case in which a second operation mode is specified.

As shown in FIG. 6, when the read command READ is input via the command/address terminal 21A, after a predetermined latency elapses, the read data DQA is subjected to burst output from the data terminal 23A. FIG. 6 shows the read data DQA which is output from any one data terminal 23A among the plurality of data terminals 23A.

The read data DQA is a binary signal, and, in the example shown in FIG. 6, the read data of a low level (L) and a high level (H) is alternately output. Herein, the specific potential of the low level (L) is VSS, and the specific potential of the high level (H) is VOH. The level of VOH is the level of VDD/3 as shown by the symbol V30 if the first operation mode is specified and is the level of VDD/2.5 as shown by the symbol V25 if the second operation mode is specified. An intermediate potential between VSS serving as the low level (L) and VOH serving as the high level (H) is a reference potential VREFDQ. Therefore, the level of the reference potential VREFDQ becomes the level of VDD/6 as shown by the symbol V30 if the first operation mode is specified and becomes the level of VDD/5 as shown by the symbol V25 if the second operation mode is specified. Thus, the amplitude of the read data DQA is different, in the case in which the first operation mode is specified and in the case in which the second operation mode is specified.

The read data of the low level (L) can be actually output by driving the data terminal 23A at a VSS level. On the other hand, the read data of the high level (H) can be actually output by driving the data terminal 23A of a semiconductor device 10a, which carries out a read operation, at a VDD level since a data terminal 7 of the controller 2, which carries out a termination operation, is driven at the VSS level as shown in FIG. 7 (A).

Herein, in a case in which the first operation mode is selected, the impedance of the data output circuit 41A in the semiconductor device 10a, which carries out the read operation, is 2RZQ, and the impedance of the data output circuit 8 in the controller 2, which carries out the termination operation, is RZQ; in this case, the level of the read data becomes VDD/3. On the other hand, in a case in which the second operation mode is selected, the impedance of the data output circuit 41A in the semiconductor device 10a, which carries out the read operation, is 1.5 RZQ, and the impedance of the data output circuit 8 in the controller 2, which carries out the termination operation, is RZQ; in this case, the level of the read data becomes VDD/2.5.

Figure 7:
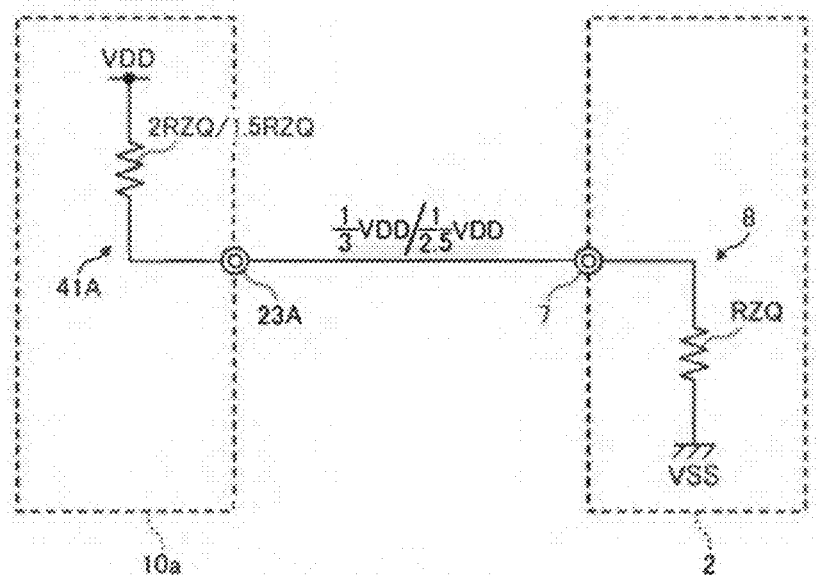
FIG. 7 (A) is a schematic drawing for explaining a method of causing the read data to be a high level, and FIG. 7 (B) is a schematic drawing for explaining a method of causing write data to be a high level.
Figure 7:
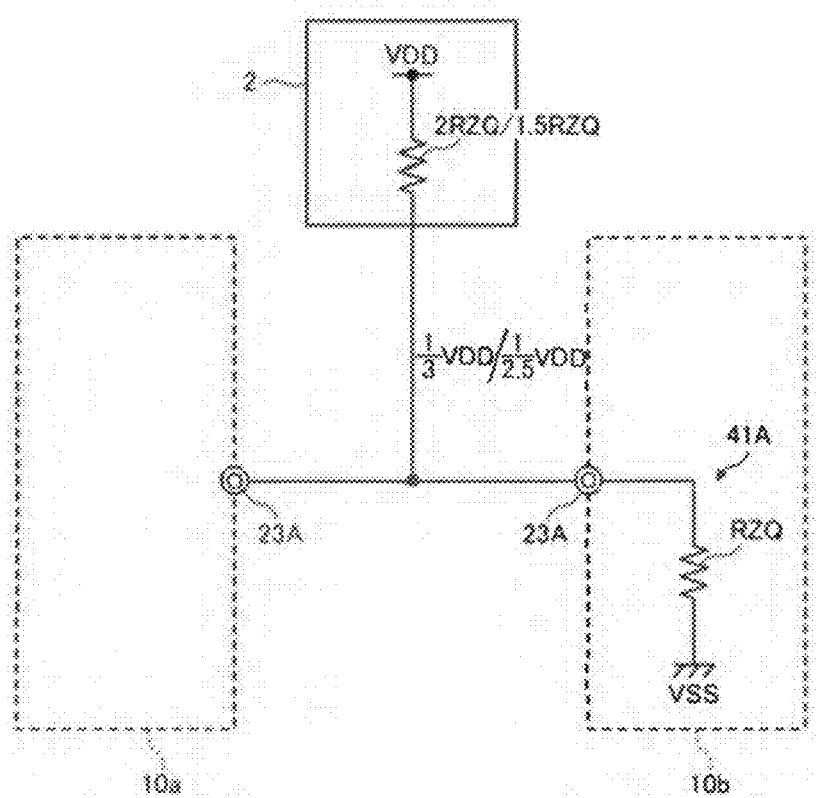

Similarly, a write operation with respect to the semiconductor device 10a can be carried out by, as shown in FIG. 7 (B), setting the impedance of the data output circuit 41A in a semiconductor device 10b, which carries out the termination operation, to RZQ, driving the circuit at the VSS level, setting the impedance of the data output circuit 8 of the controller 2 to 2RZQ or 1.5RZQ, and driving the circuit at the VDD level. Herein, instead of the semiconductor device 10b, 10a per se which receives the write operation may carry out the termination operation.

The first operation mode is preferred to be selected when an operation frequency is high (for example, 1.6 GHz). On the other hand, the second operation mode is preferred to be selected when the operation frequency is low (for example, 0.8 GHz). The operation mode is specified by the output-level select signal MRSVA, and the operation mode can be changed by rewriting the set value of the mode register 14A.

Figure 8:
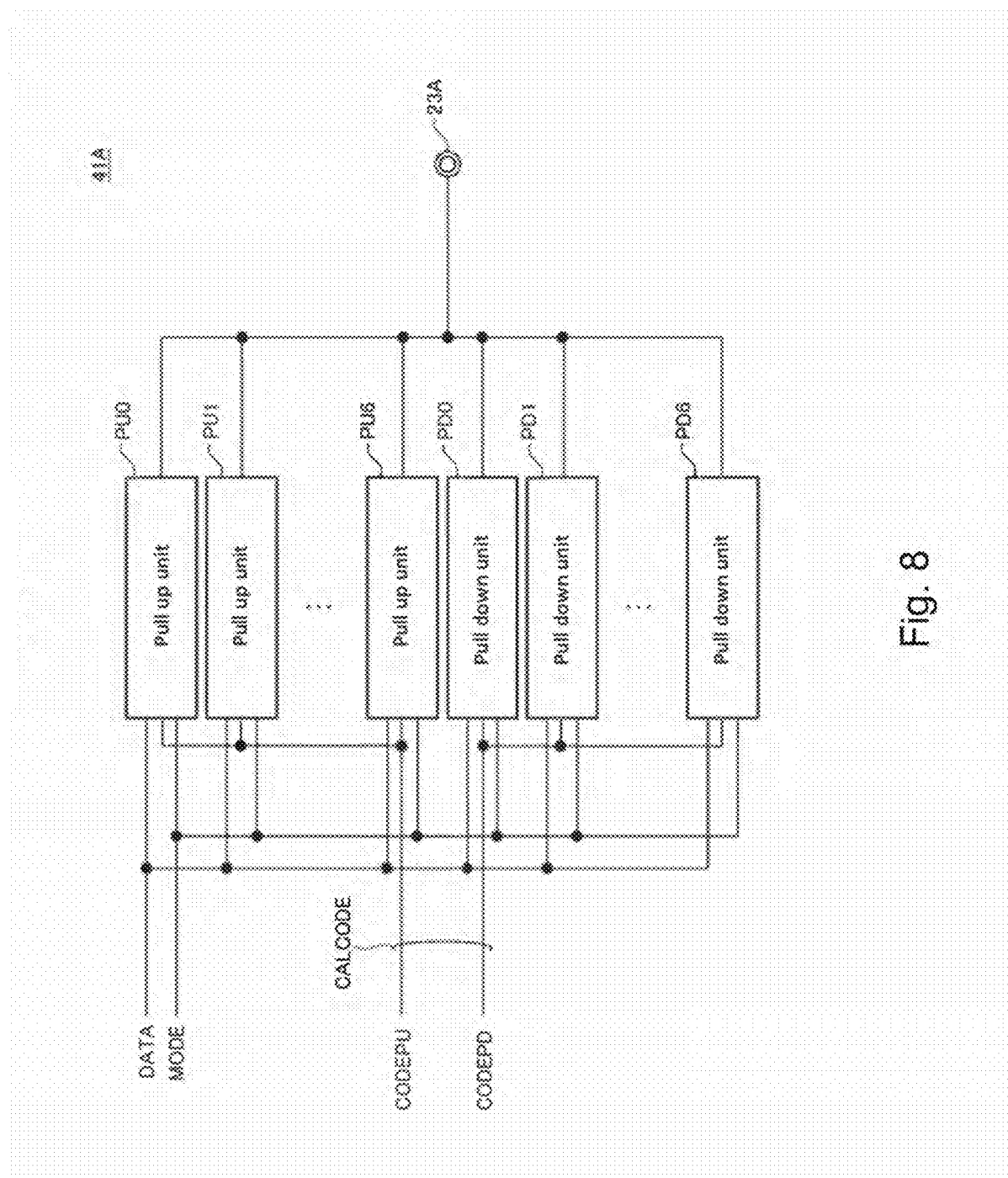
FIG. 8 is a block diagram showing a configuration of a data output circuit 41A contained in the channel CHA.

FIG. 8 is a block diagram showing a configuration of the data output circuit 41A contained in the channel CHA and shows the part allocated to the single data terminal 23A.

As shown in FIG. 8, the data output circuit 41A is provided with seven pull up units PU0 to PU6 and seven pull down units PD0 to PD6 per the single data terminal 23A. Output nodes of the pull up units PU0 to PU6 and the pull down units PD0 to PD6 are commonly connected to the data terminal 23A. The pull up units PU0 to PU6 have mutually same circuit configurations and will be simply collectively referred to as "pull up units PU" if there is no particular need to distinguish them. Similarly, the pull down units PD0 to PD6 have mutually same circuit configurations and will be simply collectively referred to as "pull down units PD" if there is no particular need to distinguish them.

The pull up unit PUi (i=0 to 6) and the pull down unit PDi (i=0 to 6) form a pair. The number of the units to be used is specified by an impedance select signal MODE output from the mode register 14A. Internal data DATA is supplied from the data control circuit 39A to the pull up units PU0 to PU6 and the pull down units PD0 to PD6. If the internal data DATA is indicating a high level, one, two, or more pull up units specified by the impedance select signal MODE is activated among the pull up units PU0 to PU6, and, as a result, the data terminal 23A is driven to the high level. On the other hand, if the internal data DATA is indicating a low level, one, two, or more pull down units specified by the impedance select signal MODE is activated among the pull down units PD0 to PD6, and, as a result, the data terminal 23A is driven to the low level.

The impedance of each of the activated pull up units PU0 to PU6 is specified by a pull up code CODEPU which is part of the adjustment code CODE. Similarly, the impedance of each of the activated pull down units PD0 to PD6 is specified by a pull down code CODEPD which is part of the adjustment code CODE.

In the present embodiment, an impedance target value of the pull up units PU0 to PU6 is, for example, 2RZQ, and an impedance target value of the pull down units PD0 to PD6 is, for example, RZQ. In this case, if the units of j pairs are used according to the impedance select signal MODE, the impedance in the case of high-level output becomes 2RZQ/j, and the impedance in the case of low-level output becomes RZQ/j.

The data output circuit 41B contained in the channel CHB also has a circuit configuration similar to that of the data output circuit 41A shown in FIG. 8. Therefore, redundant explanations are omitted.

Figure 9:
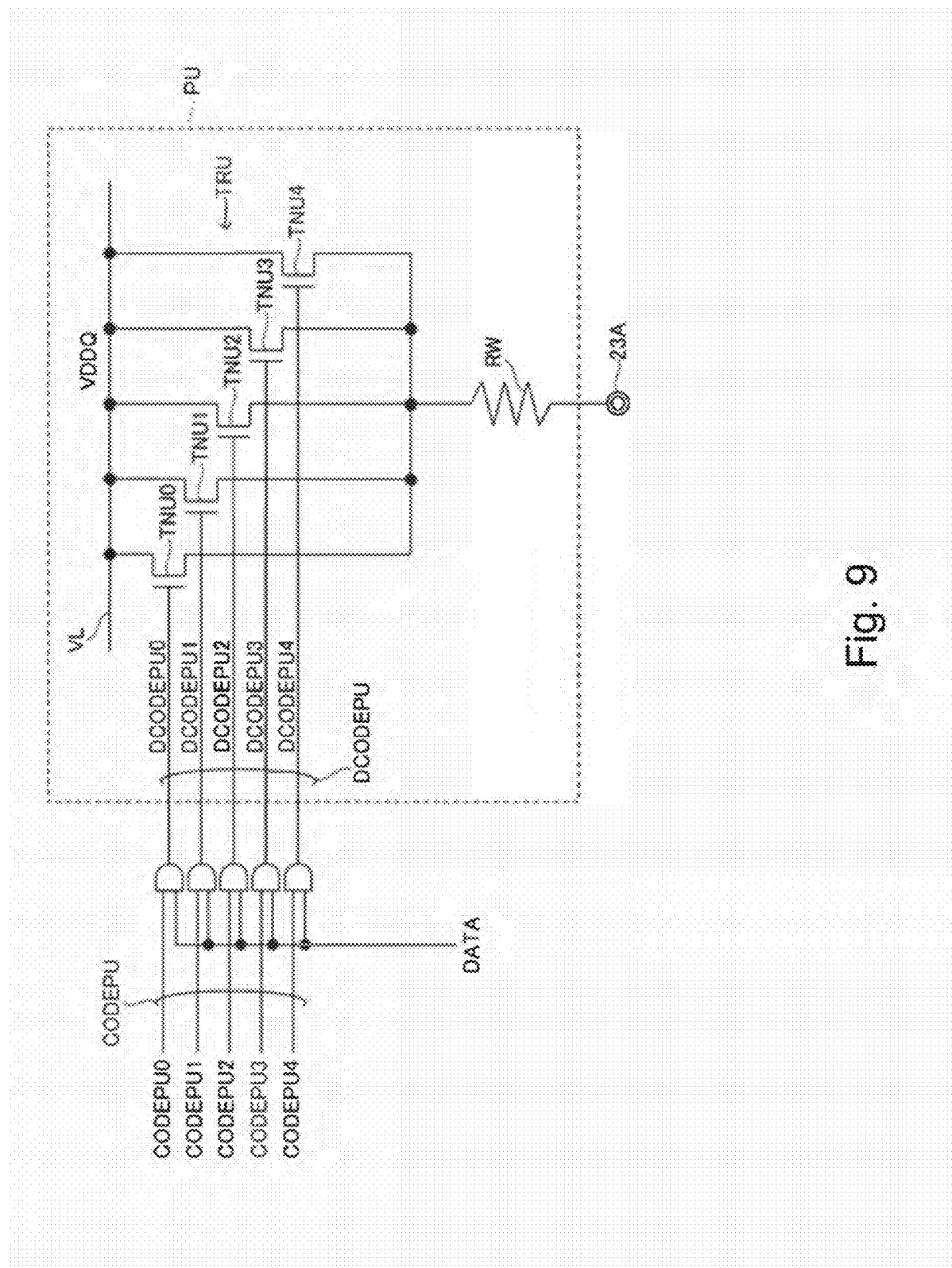
FIG. 9 is a circuit diagram of a pull up unit PU.

FIG. 9 is a circuit diagram of the pull up unit PU.

As shown in FIG. 9, the pull up unit PU is formed by a transistor portion TRU, which consists of parallely-connected five N-channel-type MOS transistors TNU0 to TNU4, and a high resistance line RW. Drains of the transistors TNU0 to TNU4 are commonly connected to a voltage line VL, which supplies the power-source potential VDD, and sources of the transistors TNU0 to TNU4 are connected to the data terminal 23A via the high resistance line RW. The high resistance line RW is, for example, a resistance of about 40 Ω consisting of, for example, a tungsten line.

Bits DCODEPU0 to DCODEPU4 constituting code signals DCODEPU are input to gate electrodes of the transistors TNU0 to TNU4, respectively. As a result, the five transistors TNU0 to TNU4 are individually subjected to on/off control based on the values of the code signals DCODEPU. As shown in FIG. 9, the code signals DCODEPU are signals which are obtained by subjecting the bits of code signals CODEPU and the internal data DATA to logic synthesis by AND gate circuits. As a result, if the internal data DATA is indicating the low level, all of the bits DCODEPU0 to DCODEPU4 constituting the code signals DCODEPU become the low level regardless of the values of the code signals CODEPU; therefore, all of the transistors TNU0 to TNU4 are turned off. On the other hand, if the internal data DATA is indicating the high level, the values of the code signals CODEPU are used as the values of the code control signals DCODEPU with no change, and some of the transistors TNU0 to TNU4 are turned on.

Herein, the ratio (W/L ratio) of the channel width (W) and the channel length (L) of the transistors TNU0 to TNU4, in other words, current supply capacity is weighted by power-of-two. Specifically, if the W/L ratio of the transistor TNU0 is 1WLnu, the W/L ratio of the transistor TNUk (k=0 to 4) is designed to $2^k \times$WLnu. By virtue of this, the impedance of the pull up unit PU can be adjusted in 32 levels at most.

Figure 10:
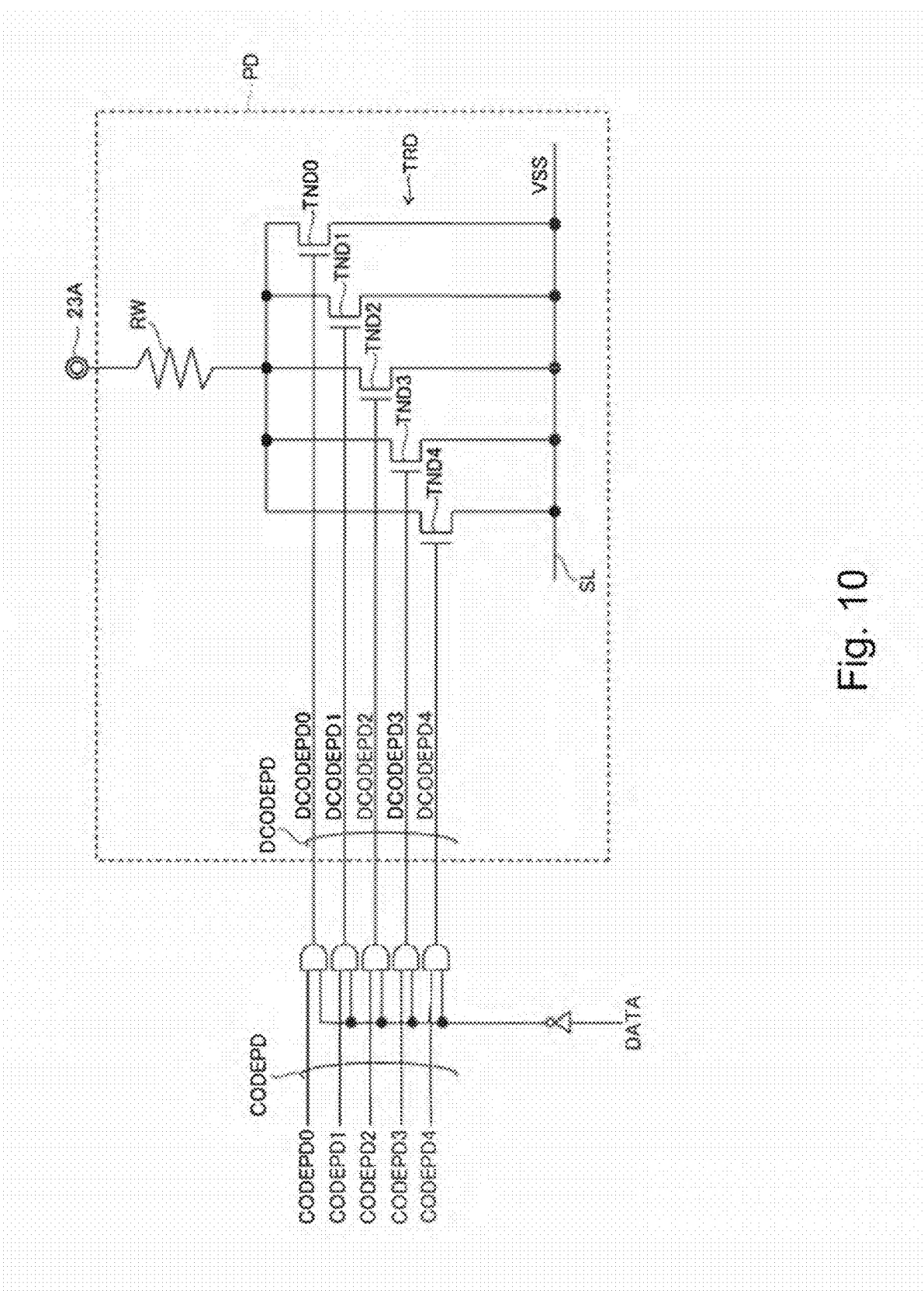
FIG. 10 is a circuit diagram of a pull down unit PD.

FIG. 10 is a circuit diagram of the pull down unit PD.

As shown in FIG. 10, the pull down unit PD is formed by a transistor portion TRD, which consists of parallely-connected five N-channel-type MOS transistors TND0 to TND4, and a high resistance line RW. Sources of the transistors TND0 to TND4 are commonly connected to a voltage line SL, which supplies a ground potential VSSQ, and drains of the transistors TND0 to TND4 are connected to the data terminal 23A via the high resistance line RW.

Bits DCODEPD0 to DCODEPD4 constituting code signals DCODEPD are supplied to gate electrodes of the transistors TND0 to TN4, respectively. As a result, the five transistors TND0 to TND4 are individually subjected to on/off control based on the values of the code signals DCODEPD. As shown in FIG. 10, the code signals DCODEPD are signals obtained by subjecting the bits of the code signals CODEPD and an inverted signal of the internal data DATA to logic synthesis by AND gate circuits. As a result, if the internal data DATA is indicating the high level, all of the bits DCODEPD0 to DCODEPD4 constituting the code signals DCODEPD become the low level regardless of the values of the code signals CODEPD; therefore, all of the transistors TND0 to TND4 are turned off. On the other hand, if the internal data DATA is indicating the low level, the values of the code signals CODEPD become the values of the code signals DCODEPD with no change, and some of the transistors TND0 to TND4 are turned on.

Herein, ratio (W/L ratio) of the channel width (W) and the channel length (L) of the transistors TND0 to TND4, in other words, current supply capacity is weighted by power-of-two. Specifically, if the W/L ratio of the transistor TND0 is 1WLnd, and the W/L ratio of the transistor TNDk (k=0 to 4) is designed to $2^k \times$WLnd. By virtue of this, the impedance of the pull down unit PD can be adjusted in 32 levels.

In this manner, the impedance of each of the pull up unit PU and the pull down unit PD can be adjusted by the code signals CODEPU or CODEPD. The code signals CODEPU and CODEPD are generated by the calibration operations by the code generator 100 shown in FIG. 3 and FIG. 4.

Figure 11:
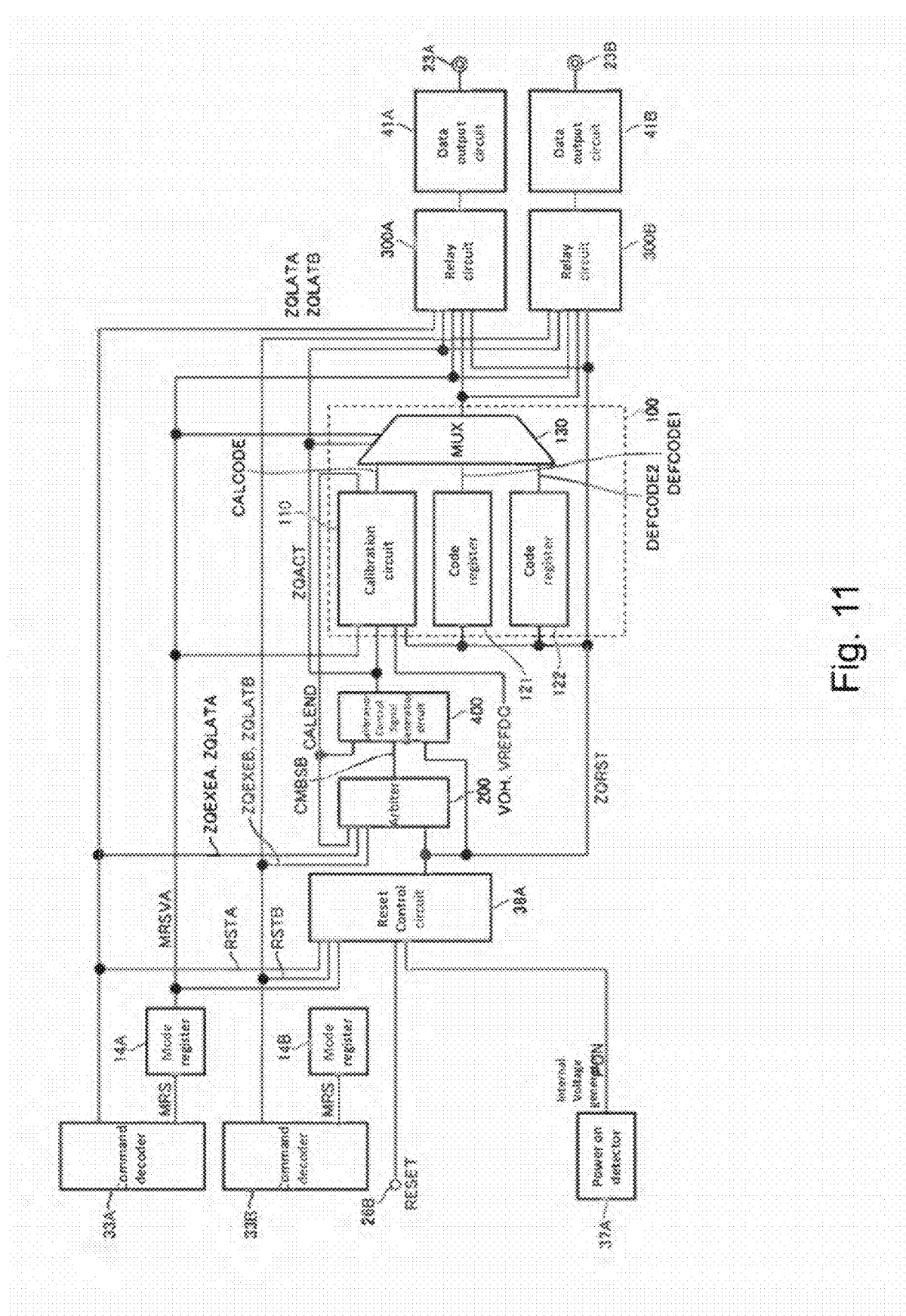
FIG. 11 is a block diagram extracting and showing a circuit block related to a calibration operation.

FIG. 11 is a block diagram extracting and showing the circuit blocks related to the calibration operation.

As shown in FIG. 11, the code generator 100 is provided with a calibration circuit 110, code registers 121 and 122, and a multiplexer 130. The calibration circuit 110 is a circuit which generates the adjustment code CALCODE by actually carrying out the calibration operation. The code register 121 is a register which sets a default code DEFCODE1 serving as an initial value of the adjustment code CALCODE of the case in which the first operation mode is selected. The code register 122 is a register which sets a default code DEFCODE2 serving as an initial value of the adjustment code CALCODE of the case in which the second operation mode is selected.

The adjustment codes CALCODE, DEFCODE1, and DEFCODE2 output from the calibration circuit 110 and the code registers 121 and 122 are input to the multiplexer 130. Based on the calibration start signal CMDSB and the output-level select signal MRSA, the multiplexer 130 outputs any of the adjustment codes CALCODE, DEFCODE1, and DEFCODE2 to the relay circuits 300A and 300B.

As shown in FIG. 11, a reset signal group ZQRST is supplied from the reset control circuit 38A to the code generator 100 and the relay circuits 300A and 300B. The reset signal group ZQRST is a signal group indicating reset states corresponding to reset requests. The reset requests include reset requests according to the reset signals RSTA, RSTB, and RESET, a reset request according to the power-on reset signal PON, and a reset request according to switching of the output-level select signal MRSVA. Then, the reset control circuit 38A activates predetermined reset signals, which constitute the reset signal group ZQRST, in accordance with these reset requests. The reset signal group ZQRST is also input to the arbiter 200 and the calibration control signal generation circuit 400.

FIG. 12 is a table for explaining the relation between the types of the reset requests and the circuit blocks serving as reset objects in the calibration circuit.

First, if reset is requested by the power-on reset signal PON or the reset signal RESET, all of the circuit blocks constituting the calibration circuit are reset. In this case, in the relay circuit 300A, the contents of a default register 303A are overwritten to input registers 301A and 302A and an output register 304A. Similarly, in the relay circuit 300B, the contents of a default register 303B are overwritten to input registers 301B and 302B and an output register 304B.

On the other hand, if reset is requested by switching of the output-level select signal MRSVA, the arbiter 200, the calibration circuit 110, and part of the relay circuits 300A and 300B are reset. In this case, the remaining circuit blocks such as the code registers 121 and 122 are not reset.

If reset is requested by the reset signal RSTA, the code generator 100 and the arbiter 200 are not reset, and only part of the circuit blocks contained in the relay circuit 300A is reset. Similarly, if reset is requested by the reset signal RSTB, the code generator 100 and the arbiter 200 are not reset, and only part of the circuit blocks contained in the relay circuit 300B is reset. Details of the relay circuits 300A and 300B will be described later.

Figure 13:
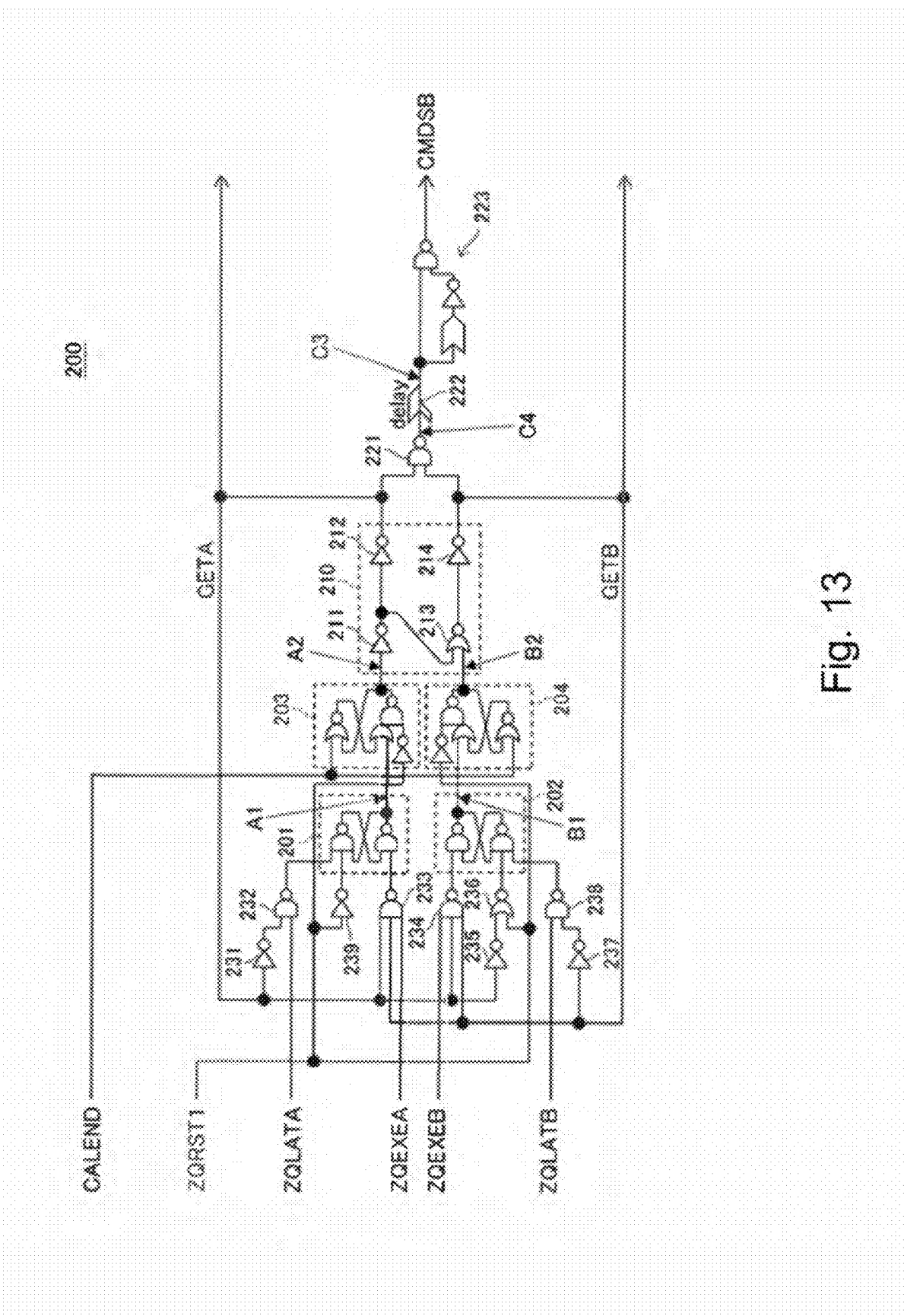
FIG. 13 is a circuit diagram of an arbiter 200.

FIG. 13 is a circuit diagram of the arbiter 200.

As shown in FIG. 13, the arbiter 200 is provided with a Set-Reset latch circuit 201, which is allocated to the channel CHA, and a Set-Reset latch circuit 202, which is allocated to the channel CHB. The Set-Reset latch circuit 201 is set by the calibration execution signal ZQEXEA and is reset by the code update signal ZQLATA. Similarly, the Set-Reset latch circuit 202 is set by the calibration execution signal ZQEXEB and is reset by the code update signal ZQLATB.

A signal A1 output from the Set-Reset latch circuit 201 is input to a level hold circuit 203. The level hold circuit 203 plays a role to maintain a signal A2 at the low level during a period until the calibration end signal CALEND is activated to the high level after the Set-Reset latch circuit 201 is set. Therefore, even if the Set-Reset latch circuit 201 is reset during the above described period, the signal A2 is maintained at the low level until the calibration end signal CALEND is activated to the high level.

A signal B1 output from the Set-Reset latch circuit 202 is input to a level hold circuit 204. The level hold circuit 204 plays a role to maintain a signal B2 at the low level during a period until the calibration end signal CALEND is activated to the high level after the Set-Reset latch circuit 202 is set. Therefore, even if the Set-Reset latch circuit 202 is reset during the above described period, the signal B2 is maintained at the low level until the calibration end signal CALEND is activated to the high level.

The signals A2 and B2 are supplied to a promotion circuit 210. The promotion circuit 210 is provided with: an inverter 211, which receives the signal A2; an inverter 212, which receives output of the inverter 211 and generates a signal GETA; a NOR circuit 213, which receives the signal B2 and the output signal of the inverter 211; and an inverter 214, which receives output of the NOR circuit 213 and generates a signal GETB.

By virtue of such a configuration, if the signal A2 is activated to the low level, the signal GETA is activated to the low level; and, if the signal B2 is activated to the low level, the signal GETB is activated to the low level. However, in a case in which the signal A2 is already at the low level, even if the signal B2 is changed to the low level, the signal GETB is not activated. On the other hand, the opposite does not come into effect, even in a case in which the signal B2 is already at the low level, if the signal A2 is changed to the low level, the signal GETB is deactivated to the high level, and the signal GETA is activated. In this manner, in the promotion circuit 210, the priority of the signal A2 is higher than that of the signal B2. Therefore, even if the calibration execution signals ZQEXEA and ZQEXEB compete with each other, the calibration execution signal ZQEXEA is configured to be prioritized. Herein, these signals GETA and GETB may be configured to be output to an external controller. This is for a reason that, when such a configuration is employed, the controller can recognize the state of the semiconductor device 10.

The signals GETA and GETB are input to a NAND circuit 221. A signal C4 output from the NAND circuit 221 is changed to a signal C3 through a delay circuit 222, and is then input to a one shot pulse generator 223. The one shot pulse generator 223 generates the one-shot calibration start signal CMDSB in response to a rising edge of the signal C3. When either one of the Set-Reset latch circuits 201 and 202 is set as a result, the calibration start signal CMDSB is activated.

The signals GETA and GETB output from the promotion circuit 210 are fed back to the Set-Reset latch circuits 201 and 202. In more detailed explanations, the signal GETA is fed back to the reset side of the Set-Reset latch circuit 201 via an inverter 231 and a NAND circuit 232, is fed back to the set side of the Set-Reset latch circuit 201 via a NAND circuit 233, is fed back to the set side of the Set-Reset latch circuit 202 via a NAND circuit 234, and is further fed back to the reset side of the Set-Reset latch circuit 202 via an inverter circuit 235 and a NOR circuit 236. Moreover, the signal GETB is fed back to the reset side of the Set-Reset latch circuit 202 via an inverter 237 and a NAND circuit 238, is fed back to the set side of the Set-Reset latch circuit 201 via the NAND circuit 233, and is further fed back to the set side of the Set-Reset latch circuit 202 via the NAND circuit 234.

The NAND circuit 233 receives the calibration execution signal ZQEXEA and the signals GETA and GETB and sets the Set-Reset latch circuit 201 by an output signal thereof. Therefore, on the condition that both of the signals GETA and GETB are deactivated to the high level, the Set-Reset latch circuit 201 is set in response to activation of the calibration execution signal ZQEXEA, and the signal A1 becomes the high level.

The NAND circuit 232 receives the inverted signal of the signal GETA and the code update signal ZQLATA and resets the Set-Reset latch circuit 201 by the output signal thereof. Therefore, on the condition that the signal GETA is activated to the low level, the Set-Reset latch circuit 201 is reset in response to activation of the code update signal ZQLATA, and the signal A1 becomes the low level. However, since part of the reset signal group ZQRST (ZQRST1) is input to the reset side of the Set-Reset latch circuit 201 via an inverter 239, if the reset signal ZQRST1 is activated, the Set-Reset latch circuit 201 is forcibly reset.

The NAND circuit 234 receives the calibration execution signal ZQEXEB and the signals GETA and GETB and sets the Set-Reset latch circuit 202 by the output signal thereof. Therefore, on the condition that both of the signals GETA and GETB are deactivated to the high level, the Set-Reset latch circuit 202 is set in response to activation of the calibration execution signal ZQEXEB, and the signal B1 becomes the high level.

The NAND circuit 236 receives the inverted signal of the signal GETB and code update signal ZQLATB and resets the Set-Reset latch circuit 202 by the output signal thereof. Therefore, on the condition that the signal GETB is activated to the low level, the Set-Reset latch circuit 202 is reset in response to activation of the code update signal ZQLATB, and the signal B1 becomes the low level. However, since the output signal of the NOR circuit 236 is input to the reset side of the Set-Reset latch circuit 202, if the output signal of the NOR circuit 236 becomes the low level, the Set-Reset latch circuit 202 is forcibly reset. Since part of the reset signal group ZQRST (ZQRST1) and the inverted signal of the signal GETA are input to the NOR circuit 236, if the reset signal ZQRST1 or the signal GETA is activated, the Set-Reset latch circuit 202 is forcibly reset.

On the other hand, even if the signal GETB is activated, the Set-Reset circuit 201 is not reset in response to that. This is for a reason that the reset side of the Set-Reset latch circuit 201 is not provided with a circuit corresponding to the NOR circuit 236.

By virtue of such a configuration, when the signal GETA is activated, the Set-Reset latch circuit 202 is forcibly reset; on the other hand, even when the signal GETB is activated, the Set-Reset latch circuit 201 is not reset. As a result, even when the calibration execution signals ZQEXEA and ZQEXEB compete with each other, the calibration execution signal ZQEXEA is configured to be prioritized.

Figure 14:
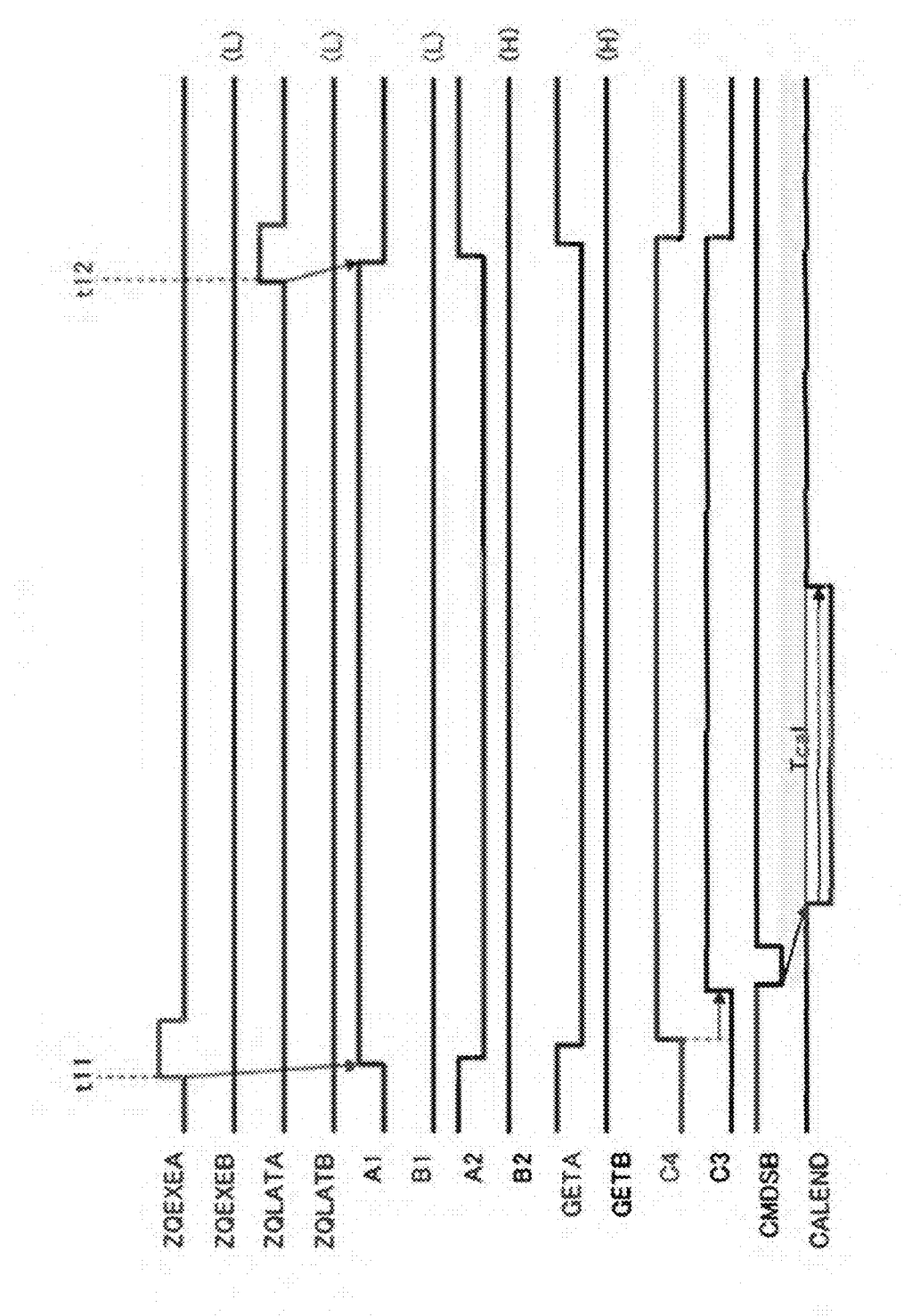
FIG. 14 is a first operation waveform diagram for explaining operations of an arbiter 200.

FIG. 14 is a first operation waveform diagram for explaining the operations of the arbiter 200.

In the example shown in FIG. 14, the calibration execution signal ZQEXEA is activated at time t11. When the calibration execution signal ZQEXEA is activated, the Set-Reset latch circuit 201 contained in the arbiter 200 is set, and, therefore, the signal A1 becomes the high level. As a result, the signal A2 is changed to the low level, and the signal GETA is activated to the low level.

When the signal GETA is activated to the low level, the signal C4 is activated, and, after elapse of a delay because of the delay circuit 222, the signal C3 is activated. As a result, a one-shot pulse of the calibration start signal CMDSB is generated, and the calibration operation by the code generator 100 is started. When the calibration operation is started, the calibration end signal CALEND is once changed to the low level. The calibration operation requires predetermined time Tcal; and, when the calibration operation is completed, the calibration end signal CALEND is returned to the high level. When the calibration end signal CALEND becomes the high level, the value of the adjustment code CALCODE is determined.

Then, when the code update signal ZQLATA is activated at time t12, the Set-Reset latch circuit 201 is reset and returns to the state before the time t11. As described later, when the code update signal ZQLATA is activated, the adjustment code CODE is supplied to the data output circuit 41A of the channel CHA, and, as a result, the output impedance is updated.

When the calibration execution signal ZQEXEA and the code update signal ZQLATA are activated in this order in this manner, the output impedance of the data output circuit 41A is updated.

Figure 15:
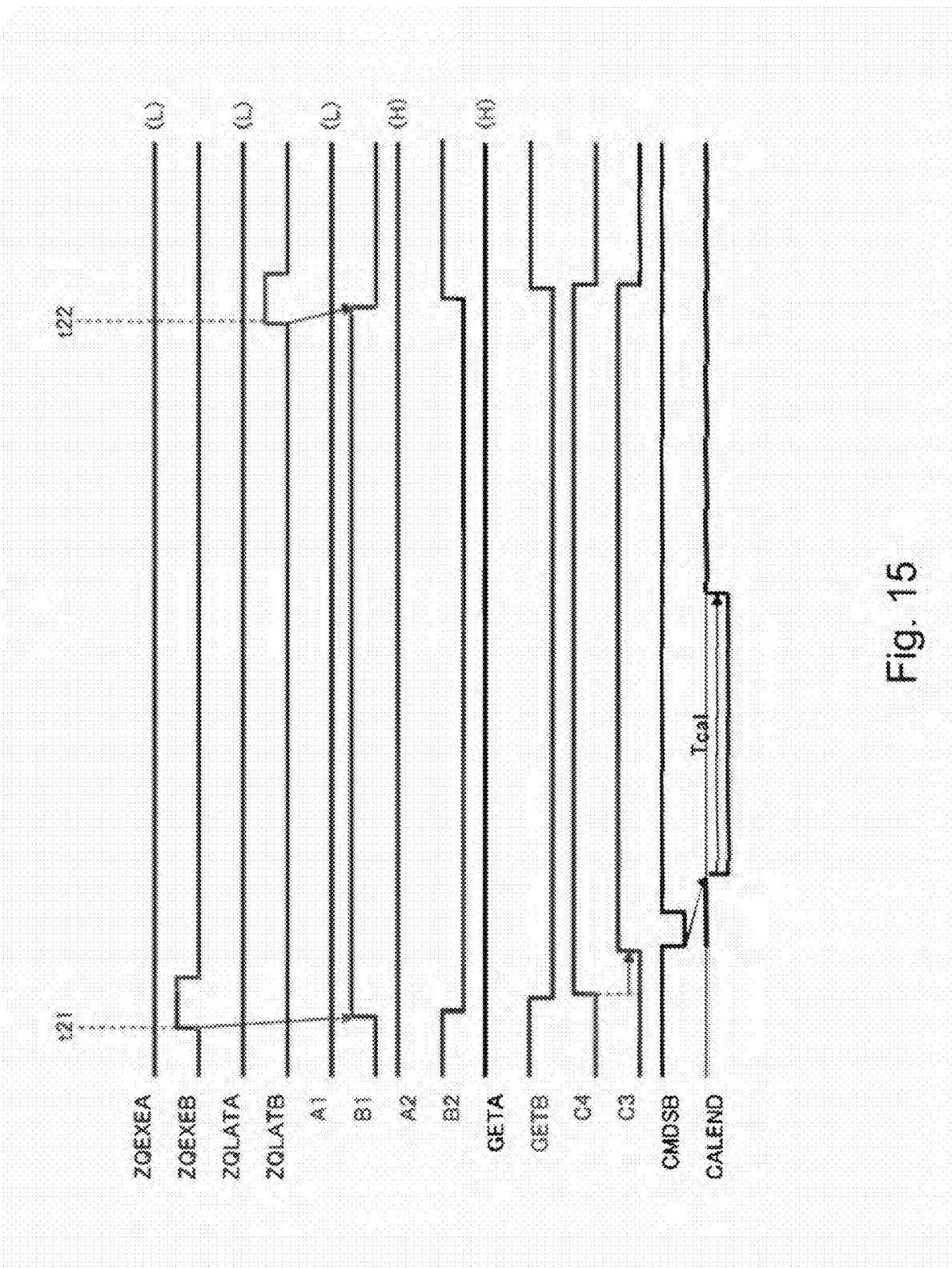
FIG. 15 is a second operation waveform diagram for explaining operations of the arbiter 200.

FIG. 15 is a second operation waveform diagram for explaining the operations of the arbiter 200.

In the example shown in FIG. 15, the calibration execution signal ZQEXEB is activated at time t21. When the calibration execution signal ZQEXEB is activated, the Set-Reset latch circuit 202 contained in the arbiter 200 is set; therefore, the signal B1 becomes the high level. As a result, the signal B2 is changed to the low level, and the signal GETB is activated to the low level.

When the signal GETB is activated to the low level, the signal C4 is activated. Therefore, a one-shot pulse of the calibration start signal CMDSB is generated, and the calibration operation by the code generator 100 is started.

Then, when the code update signal ZQLATB is activated at time t22, the Set-Reset latch circuit 202 is reset and returns to the state before the time t21. As described later, when the code update signal ZQLATB is activated, the adjustment code CODE is supplied to the data output circuit 41B of the channel CHB, and, as a result, the output impedance is updated.

When the calibration execution signal ZQEXEB and the code update signal ZQLATB are activated in this order in this manner, the output impedance of the data output circuit 41B is updated.

Figure 16:
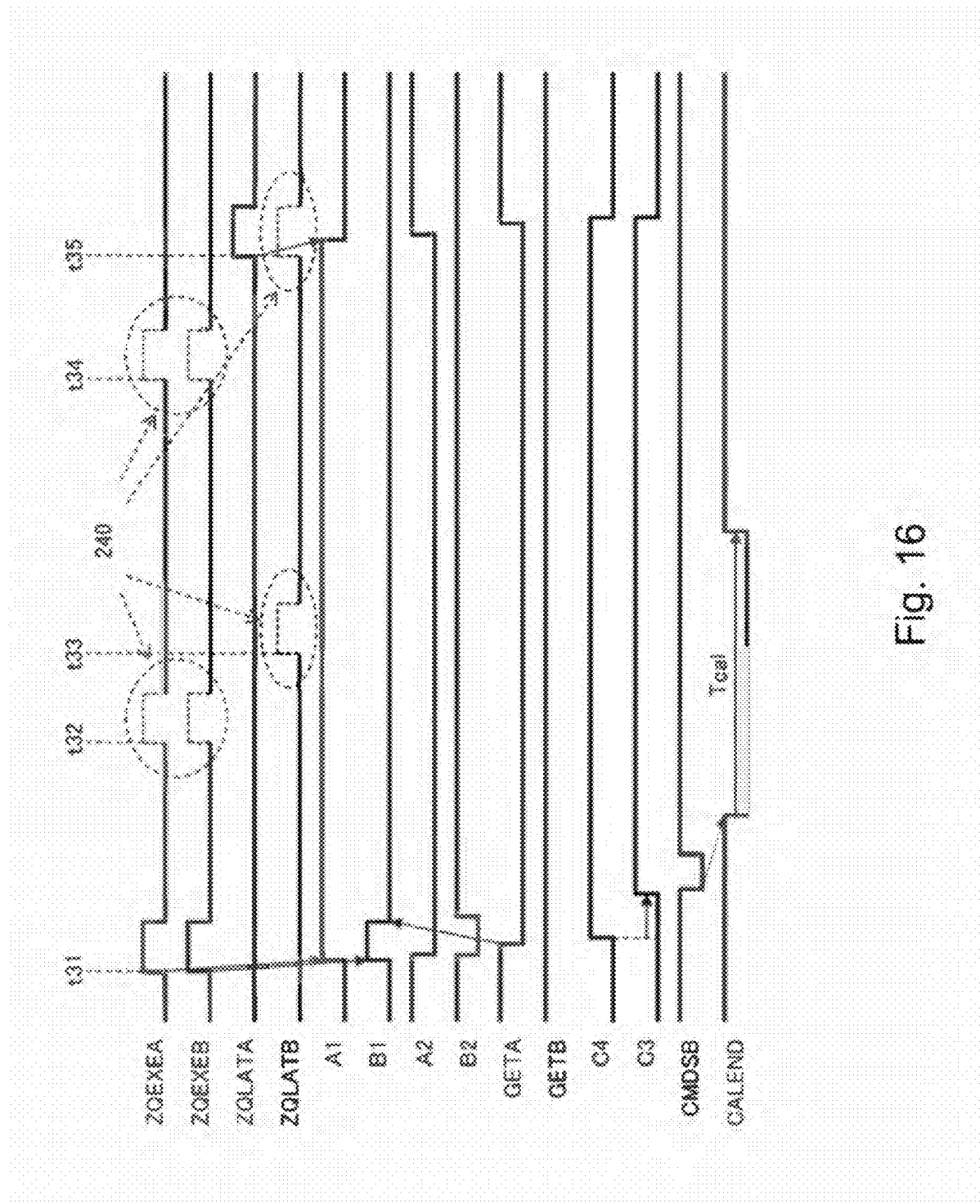
FIG. 16 is a third operation waveform diagram for explaining operations of the arbiter 200.

FIG. 16 is a third operation waveform diagram for explaining the operations of the arbiter 200.

In the example shown in FIG. 16, the calibration execution signals ZQEXEA and ZQEXEB are activated at the same time at time t31. The calibration execution signal ZQEXEA is generated by the command decoder 33A of the channel CHA, and the calibration execution signal ZQEXEB is generated by the command decoder 33B of the channel CHB; therefore, these signals are mutually asynchronous. Therefore, for example, if the phases of the external clock signals CKA and /CKA input to the channel CHA and the external clock signals CKB and /CKB input to the channel CHB are approximately matched with each other, a case in which the calibration execution signals ZQEXEA and ZQEXEB are activated at the same time as shown in FIG. 14 is conceivable.

When the calibration execution signals ZQEXEA and ZQEXEB are activated, both of the Set-Reset latch circuits 201 and 202 contained in the arbiter 200 are set; and, therefore, both of the signals A1 and B1 become the high level. The signals A2 and B2 are changed to the low level in response to that; however, since the signal A2 is prioritized by the function of the above described promotion circuit 210, the signal GETA is activated to the low level, while the signal GETB is maintained at the high level.

Furthermore, when the signal GETA is activated to the low level, the Set-Reset latch circuit 202 is reset via the NOR circuit 236. As a result, the signal B1 returns to the low level. Therefore, among the calibration execution signals ZQEXEA and ZQEXEB input at the same time, the calibration execution signal ZQEXEA side is enabled, and the calibration execution signal ZQEXEB is cancelled.

When the signal GETA is activated to the low level, the signal C4 is activated. Therefore, a one-shot pulse of the calibration start signal CMDSB is generated, and the calibration operation by the code generator 100 is started.

During that period, in the example shown in FIG. 16, the calibration execution signals ZQEXEA and ZQEXEB and the code update signals ZQLATB are input. In a case in which the output impedance of the data output circuit 41A is to be updated as shown in FIG. 14, the calibration execution signal ZQEXEA and the code update signal ZQLATA have to be input in this order. However, in the example shown in FIG. 16, after the calibration execution signal ZQEXEA is input and before the code update signal ZQLATA is input, illegal calibration execution signals ZQEXEA are input at time t32 and t34. At the time t32 and t34, the calibration execution signals ZQEXEB are also input, and the code update signal ZQLATB is also input at time t33.

However, these signals are cancelled as shown by a symbol 240. First, the calibration execution signals ZQEXEA and ZQEXEB input at the time t32 and t34 are cancelled by the NAND circuits 233 and 234 since the signal GETA is at the low level. The code update signal ZQLATB input at the time t33 is cancelled by the NAND circuit 238 since the signal GETB is at the high level.

Then, when the code update signal ZQLATA is activated at time t35, the Set-Reset latch circuit 201 is reset, and the state returns to the state before the time t31. In the example shown in FIG. 16, the code update signal ZQLATB is also activated at the same time at the time t35. However, the code update signal ZQLATB input at the time t35 is also cancelled by the NAND circuit 238 since the signal GETB is at the high level.

Even in the case in which the calibration execution signals ZQEXEA and ZQEXEB compete with each other like this case or in the case in which the illegal calibration execution signals ZQEXEA and ZQEXEB or code update signals ZQLATA and ZQLATB are input, arbitration of these signals is carried out by the arbiter 200. In the example shown in FIG. 16, only the calibration execution signal ZQEXEA input at the time t31 and the code update signal ZQLATA input at the time t35 are enabled, and, as a result, the output impedance of the data output circuit 41A is updated.

Even in the case in which the code update signals ZQLATA and ZQLATB are cancelled in the arbiter 200, code update commands per se which are the origins of the code update signals ZQLATA and ZQLATB are not cancelled. Therefore, even in the case in which the code update signal ZQLATA is cancelled in the arbiter 200, the code update signal ZQLATA is enabled in the relay circuit 300A, and a later-described latch operation is carried out. Similarly, even in the case in which the code update signal ZQLATB is cancelled in the arbiter 200, the code update signal ZQLATB is enabled in the relay circuit 300B, and a later-described latch operation is carried out.

Figure 17:
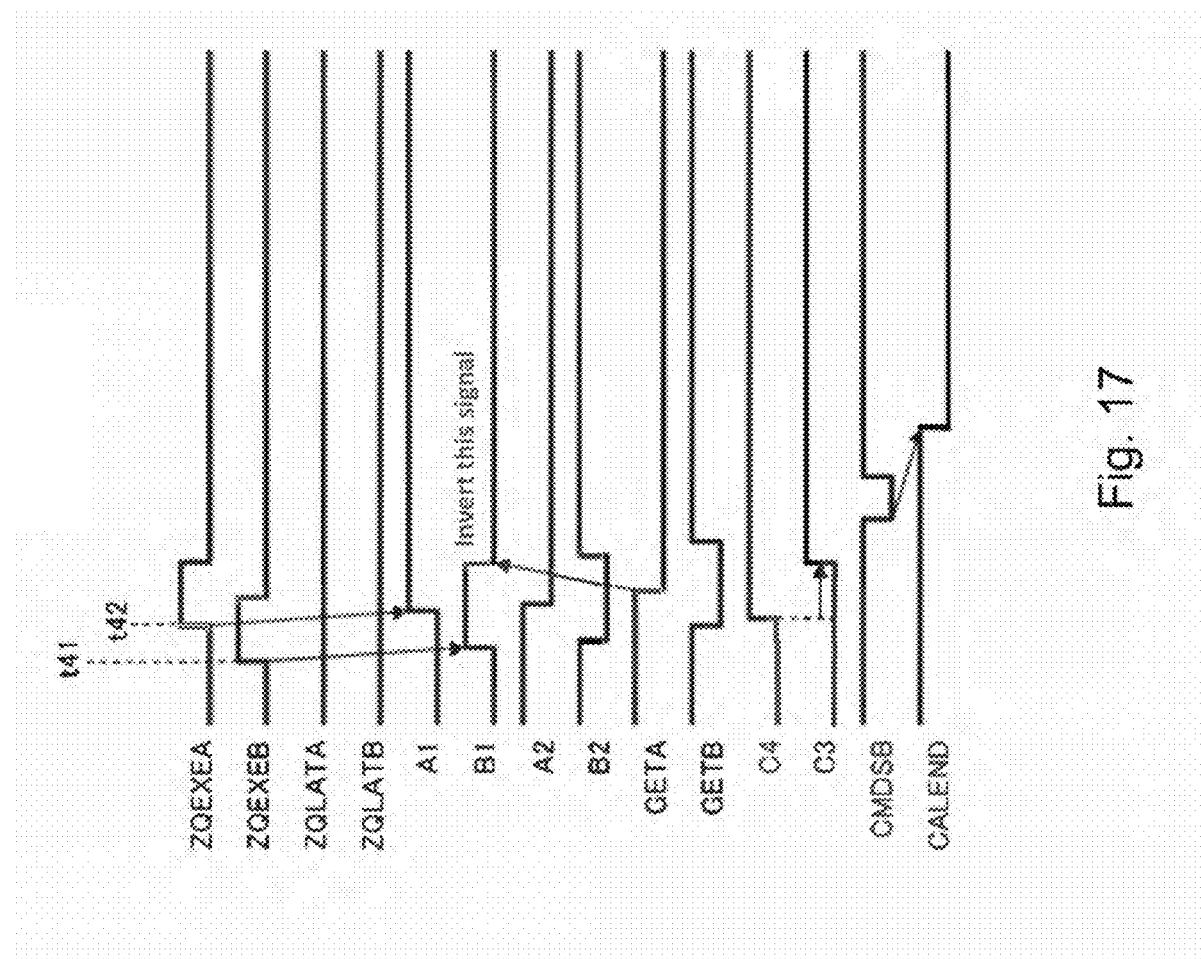
FIG. 17 is a fourth operation waveform diagram for explaining operations of the arbiter 200.

FIG. 17 is a fourth operation waveform diagram for explaining the operations of the arbiter 200.

In the example shown in FIG. 17, immediately after the calibration execution signal ZQEXEB is activated at time t41, the calibration execution signal ZQEXEA is activated at time t42. Since the calibration execution signals ZQEXEA and ZQEXEB are asynchronously generated by the channels CHA and CHB, such an input pattern is also conceivable.

In this case, the Set-Reset latch circuit 202 is set in response to the calibration execution signal ZQEXEB, the signal B1 becomes the high level, then, the Set-Reset latch circuit 201 is set in response to the calibration execution signal ZQEXEA, and the signal A1 becomes the high level. As a result, the signals GETB and GETA are activated in this order. Then, the signal C4 is activated in response to the signal GETB, which has been activated first. Therefore, a one-shot pulse of the calibration start signal CMDSB is generated, and the calibration operation by the code generator 100 is started.

On the other hand, when the signal GETA is activated to the low level, the output signal of the NOR circuit 236 becomes the low level. Therefore, the Set-Reset latch circuit 202 is forcibly reset. As a result, the calibration execution signal ZQEXEB is substantially cancelled, and only the calibration execution signal ZQEXEA is enabled.

In this manner, not only in the case in which the calibration execution signals ZQEXEA and ZQEXEB are input at the same time, but also in the case in which these signals are input with a short time lag, the calibration execution signal ZQEXEA corresponding to the channel CHA is prioritized. However, if the calibration execution signal ZQEXEA is input with a certain time lag or more after the calibration execution signal ZQEXEB is input, since the output signal of the NAND circuit 233 is fixed by the signal GETB, the calibration execution signal ZQEXEA is cancelled.

Figure 18:
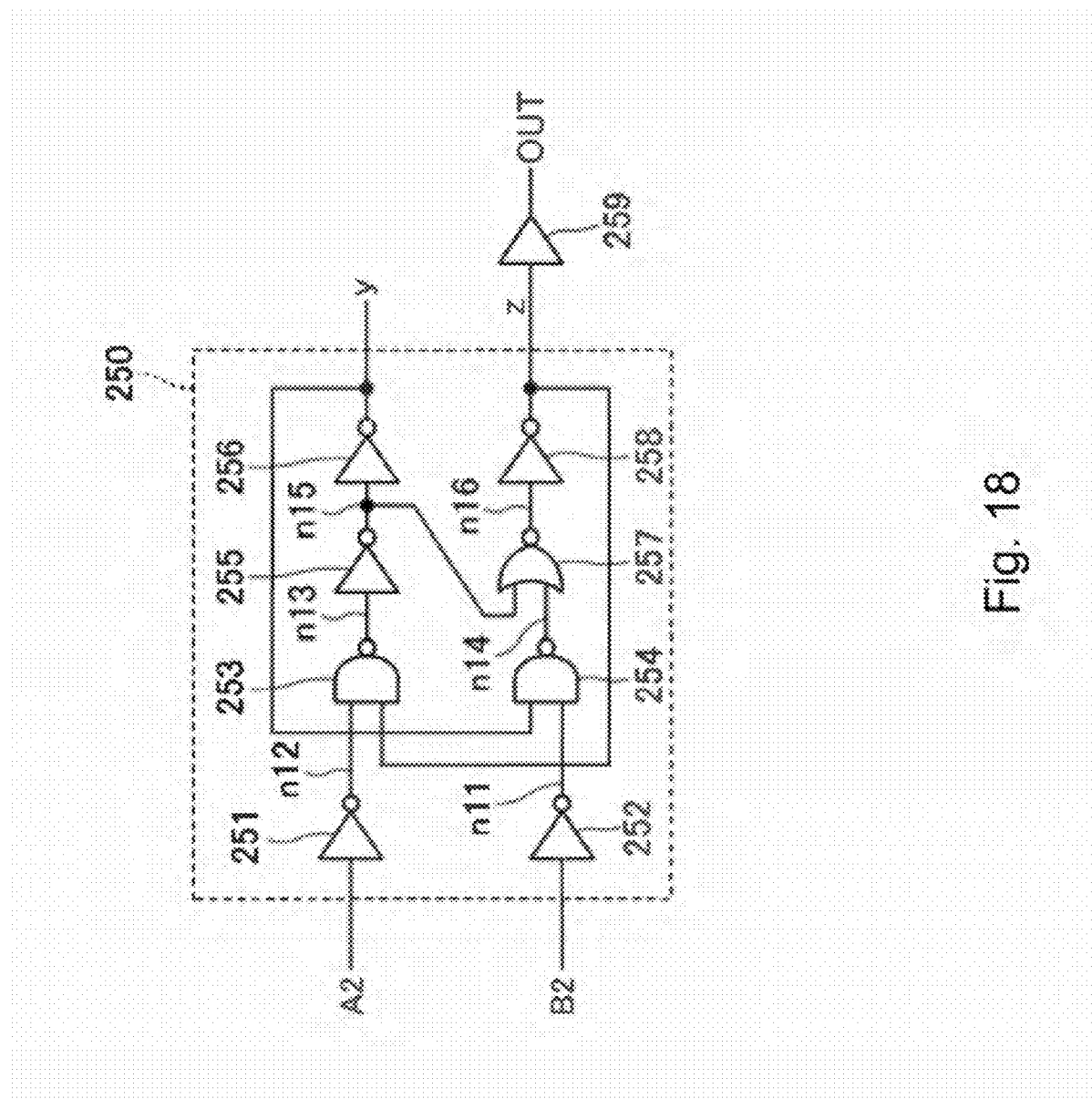
FIG. 18 is a circuit diagram of a promotion circuit 250 according to a modification example.

FIG. 18 is a circuit diagram of a promotion circuit 250 according to a modification example.

The promotion circuit 250 shown in FIG. 18 is a Set-Reset latch circuit of a type which is set by the signal A2 and is reset by the signal B2. Output signals y and z correspond to the above described signals GETA and GETB.

The promotion circuit 250 is provided with: an inverter 251, which inverts the signal A2; an inverter 252, which inverts the signal B2; a NAND circuit 253, which receives the inverted signal A2 and the signal Z; and a NAND circuit 254, which receives the inverted signal B2 and the signal y. The output signal of the NAND circuit 253 is output as the signal y via inverters 255 and 256. On the other hand, the output signal of the NAND circuit 254 and the output signal of the inverter 255 are input to a NOR circuit 257. The output signal of the NOR circuit 257 is output as the signal z via an inverter 258.

By virtue of such a configuration, when the signal A2 is changed to the low level, the signal y is changed to the low level, and the output signal of the NAND circuit 254 is fixed; therefore, even if the signal B2 is changed to the low level thereafter, the signal Z maintains the high level. Similarly, when the signal B2 is changed to the low level, the signal z is changed to the low level, and the output signal of the NAND circuit 253 is fixed; therefore, even if the signal A2 is changed to the low level thereafter, the signal y maintains the high level.

However, in a case in which the time lag between the changes of the signals A2 and B2 to the low level is extremely short, specifically, in a case in which both of them are changed to the high level with a time lag of less than the feed-back time of the signals y and z, the signal A2 is prioritized. For example, the signal B2 becomes the low level first, and, then, the signal A2 is changed to the low level before the signal z is fed back to the NAND circuit 253; in this case, the signal z is cancelled by the NOR circuit 257, and the signal A2 is effectively received. As a result, instead of the signal z, the signal y becomes the low level.

Such an operation does not occur if the input order of the signals A2 and B2 is the opposite. More specifically, the signal y changed to the low level is not cancelled even if the signal A2 becomes the low level first, and, then, the signal B2 is changed to the low level before the signal y is fed back to the NAND circuit 254. In other words, as well as the promotion circuit 210, the priority of the signal A2 is higher than that of the signal B2.

The promotion circuit 250 shown in FIG. 18 can be used not only instead of the promotion circuit 210 shown in FIG. 13, but can be also used instead of the entire arbiter 200. For example, if the calibration execution signals ZQEXEA and ZQEXEB are so-called level signal, both of them can be subjected to arbitration by the promotion circuit 250 shown in FIG. 18.

Figure 19:
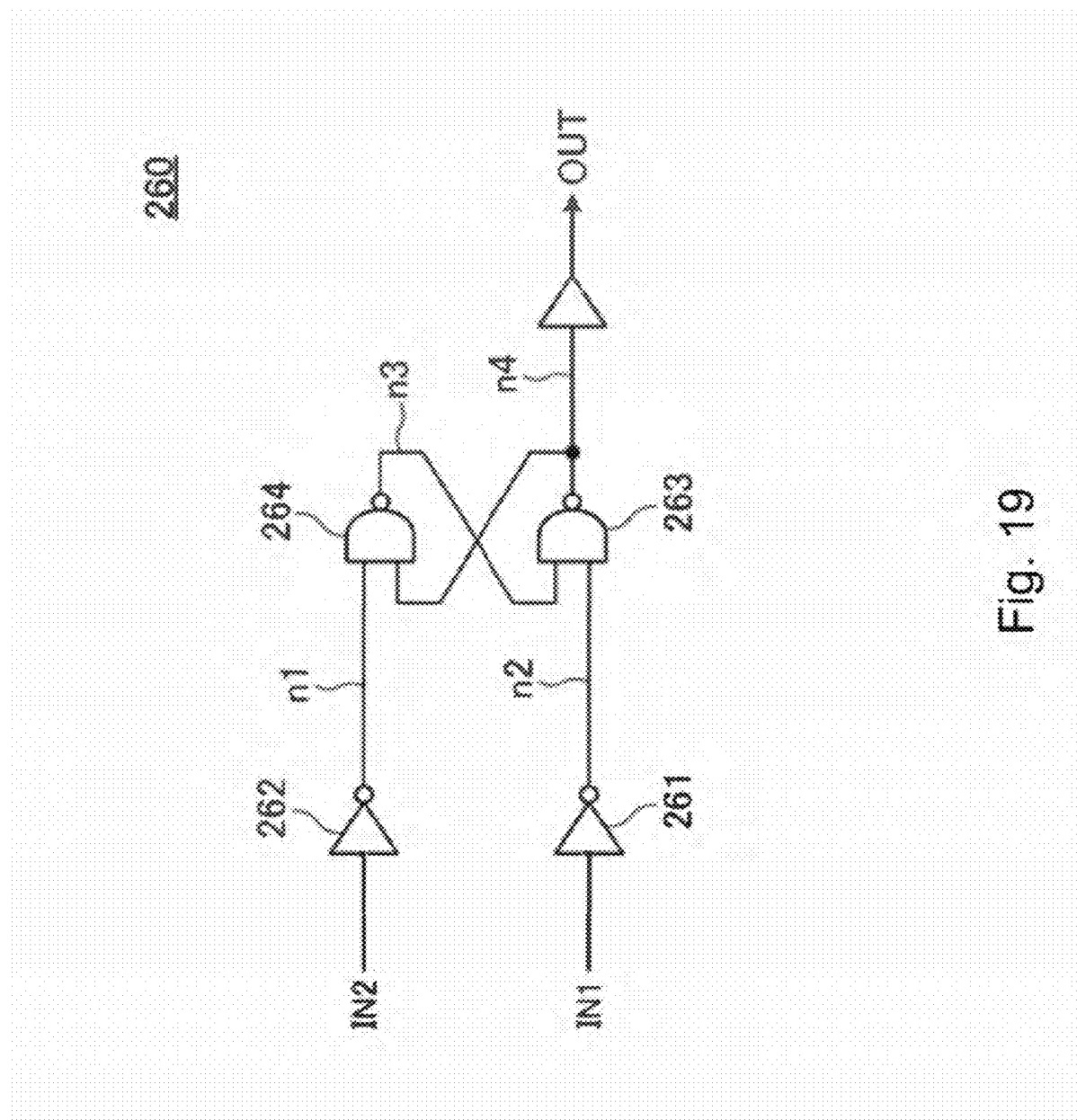
FIG. 19 is a circuit diagram of a general Set-Reset latch circuit 260.

FIG. 19 is a circuit diagram of a general Set-Reset latch circuit 260.

The Set-Reset latch circuit 260 shown in FIG. 19 is formed by inverters 261 and 262, which invert input signals IN1 and IN2, and NAND circuits 263 and 264, which receive the output signals of the inverters 261 and 262 and are recurrently connected. In the Set-Reset latch circuit 260 like this, the input signals IN1 and IN2 do not have the order of priorities. Therefore, if the input signals IN1 and IN2 are changed with a short time lag therebetween, a metastable state is temporarily obtained.

Figure 20:
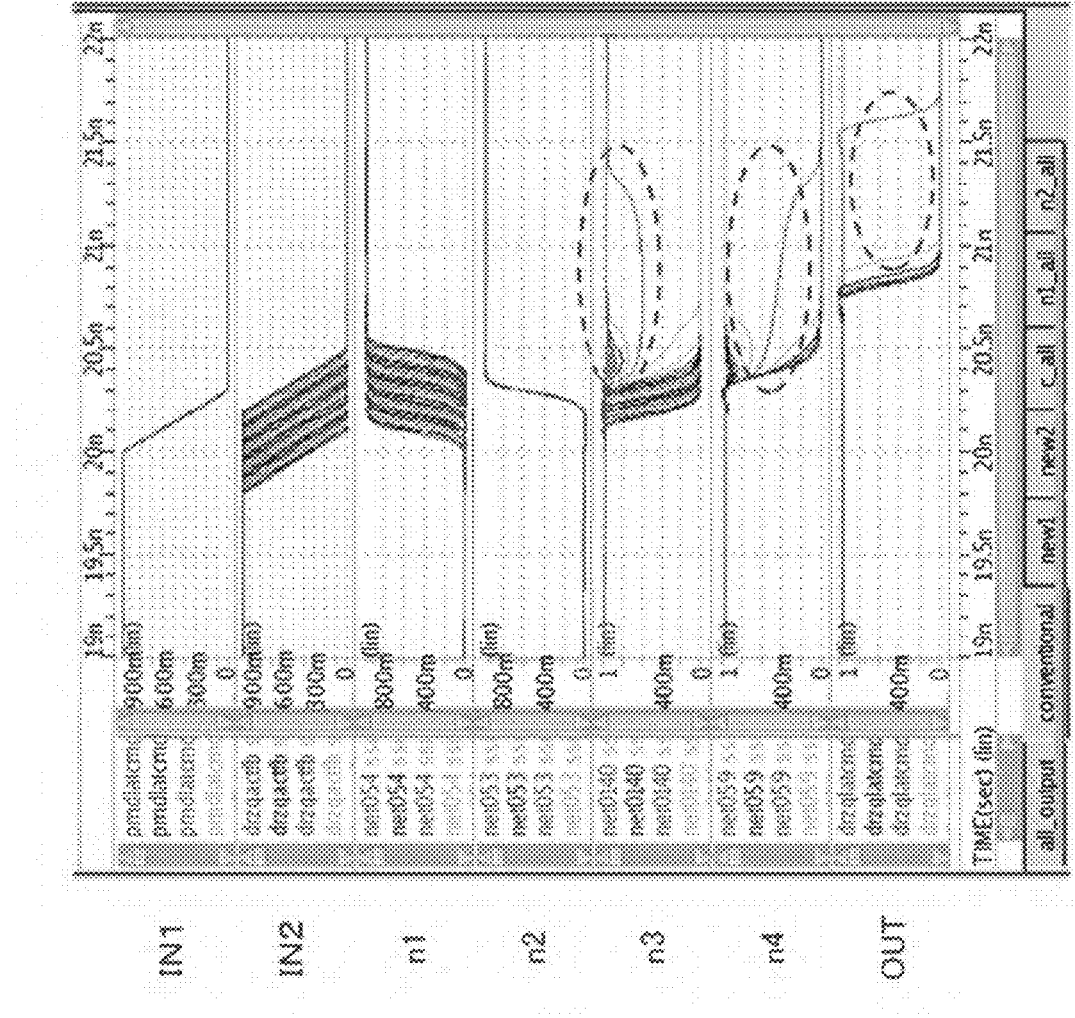
FIG. 20 is a waveform diagram for explaining operations of a Set-Reset latch circuit 260.

FIG. 20 is a waveform diagram for explaining the operations of the Set-Reset latch circuit 260.

In FIG. 20, the input signal IN1 is changed from the high level to the low level at predetermined timing, and the timing of changing the input signal IN2 from the high level to the low level is changed with respect to the input signal IN1. FIG. 20 also shows the levels of nodes n1 to n4 shown in FIG. 19. An output signal OUT is a signal obtained by buffering the level of the node n4 by a buffer 265.

As shown in FIG. 20, depending on the change timing of the input signal IN2, the levels of the nodes n3 and n4 are not normally changed, and it can be understood that a so-called metastable state is obtained. Therefore, depending on the change timing of the input signal IN2, the timing at which the output signal OUT is changed is significantly delayed.

Figure 21:
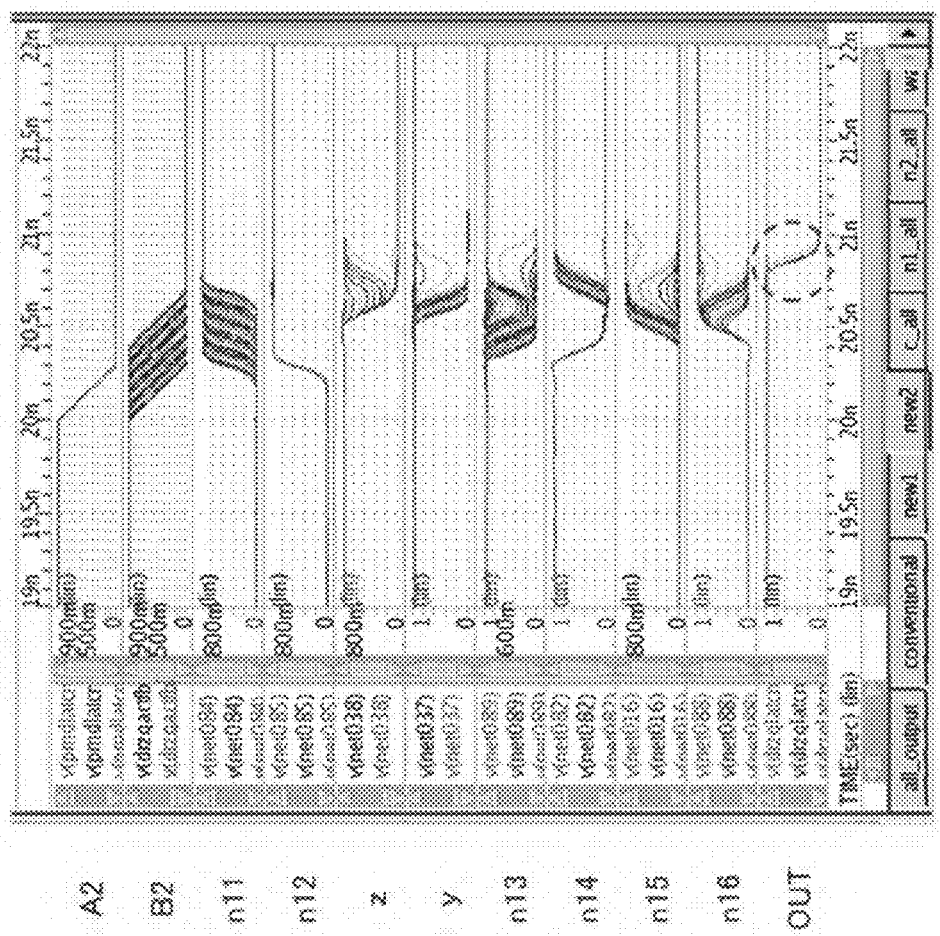
FIG. 21 is a waveform diagram for explaining operations of the promotion circuit 250.

FIG. 21 is a waveform diagram for explaining the operations of the promotion circuit 250.

Also in FIG. 21, the signal A2 is changed from the high level to the low level at predetermined timing, and the timing of changing the signal B2 from the high level to the low level is changed with respect to the signal A2. FIG. 21 also shows the levels of nodes n11 to n16 shown in FIG. 18. The output signal OUT is a signal obtained by buffering the output signal z by a buffer 259.

As shown in FIG. 21, it can be understood that, depending on the change timing of the signal B2, the levels of the nodes are not normally changed, and the so-called metastable state is almost obtained, but the metastable state is eliminated in a short period of time. Therefore, the timing at which the output signal OUT is changed is not delayed.

Figure 22:
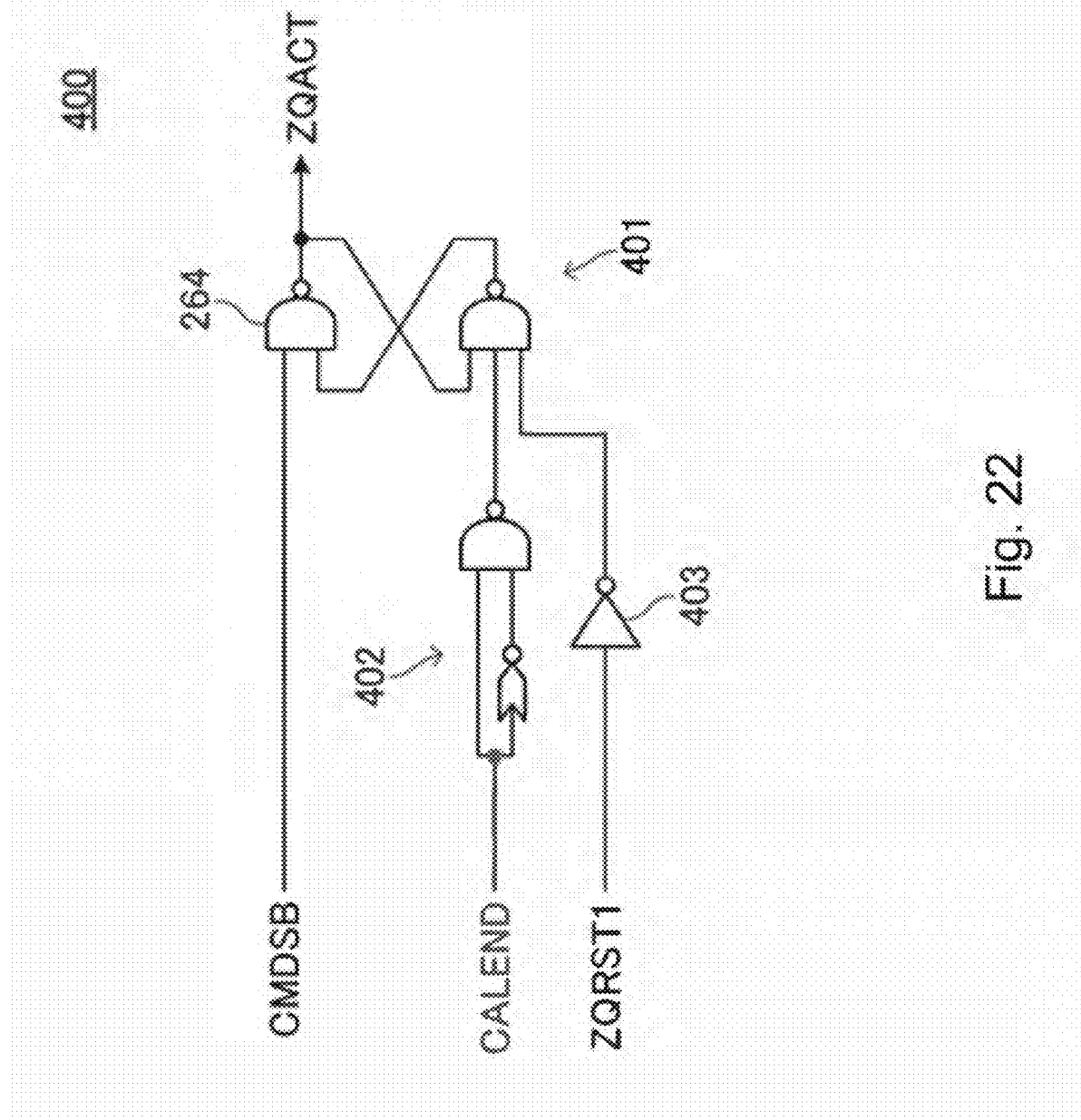
FIG. 22 is a circuit diagram of a calibration control signal generation circuit 400.

FIG. 22 is a circuit diagram of the calibration control signal generation circuit 400.

Figure 23:
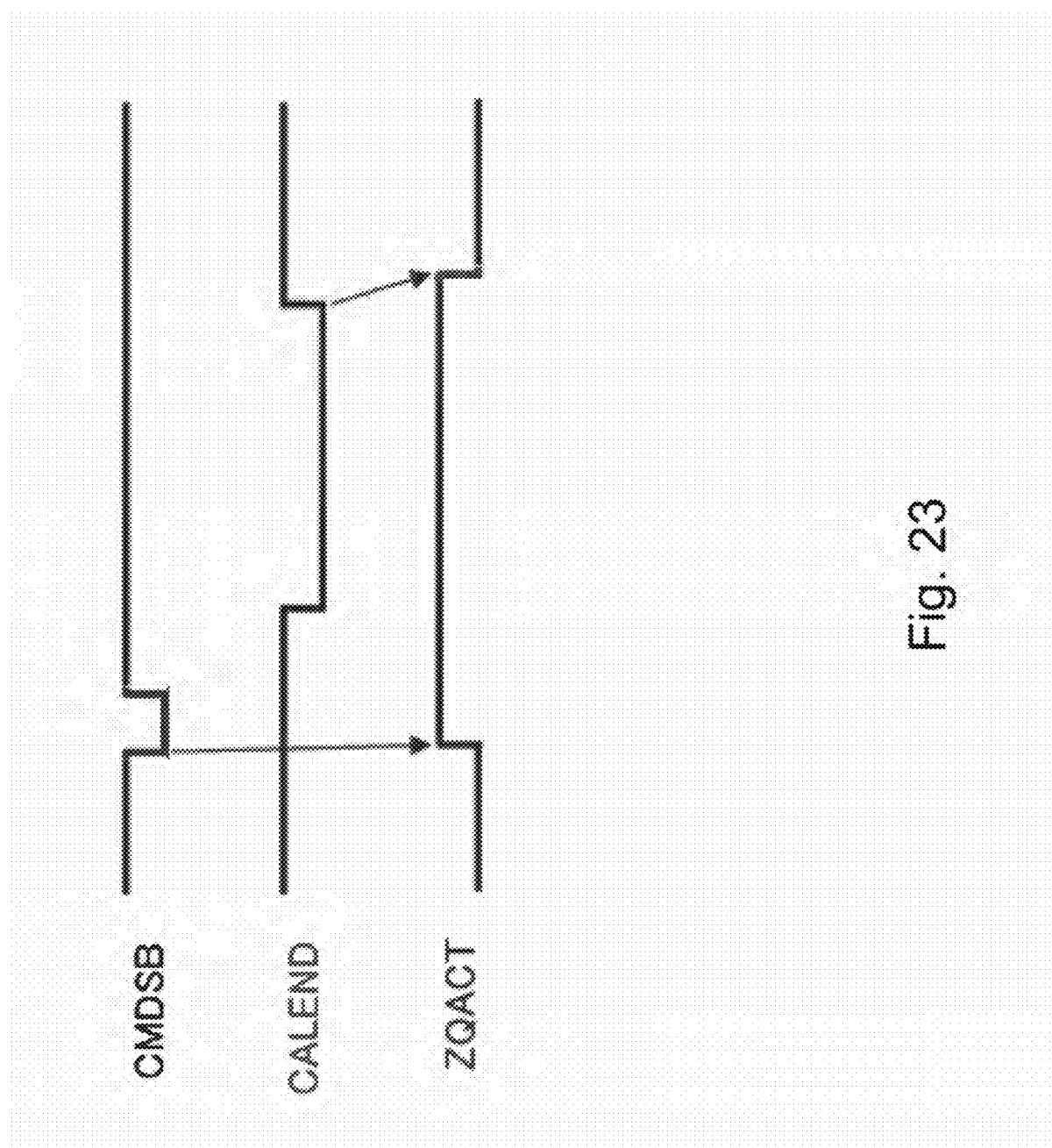
FIG. 23 is a waveform diagram for explaining operations of the calibration control signal generation circuit 400.

As shown in FIG. 2, the calibration control signal generation circuit 400 is provided with a Set-Reset latch circuit 401. The calibration start signal CMDSB is input to the set side of the Set-Reset latch circuit 401, and the calibration end signal CALEND is input to the reset side thereof via a one shot pulse generator 402. According to such a configuration, as shown in FIG. 23, after the one-shot calibration start signal CMDSB is activated, during the period until the calibration end signal CALEND is changed to the high level, the calibration control signal ZQACT becomes the high level. The calibration control signal ZQACT is used as a state signal which indicates that the calibration circuit 110 is carrying out the calibration operation.

Part of the reset signal group ZQRST (ZWRST1) is also input to the reset side of the Set-Reset latch circuit 401 via an inverter 403. Therefore, if the reset signal group ZQRST1 is activated, the Set-Reset latch circuit 401 is forcibly reset, and the calibration control signal ZQACT becomes the low level.

Figure 24:
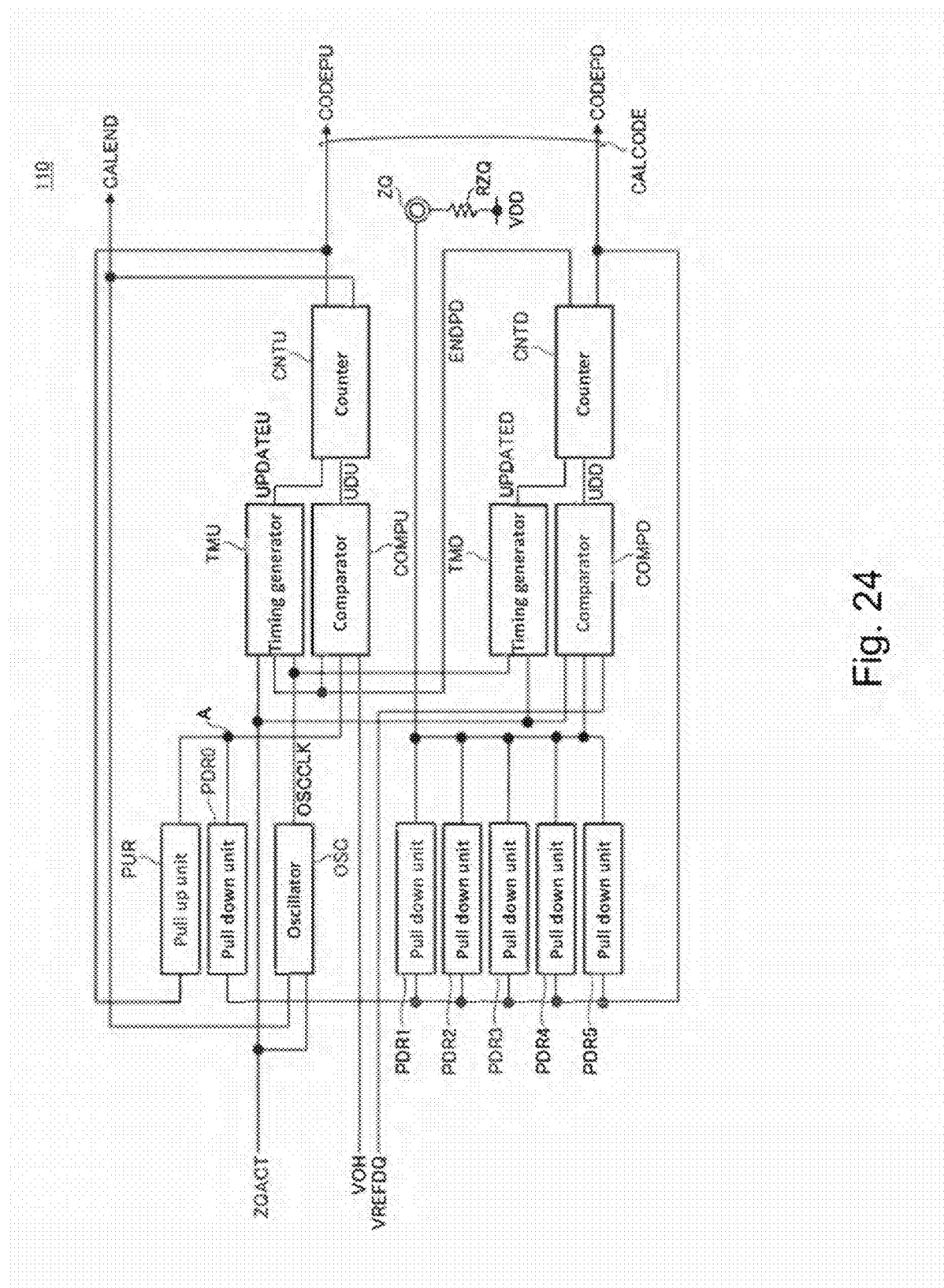
FIG. 24 is a block diagram of a calibration circuit 110.

FIG. 24 is a block diagram of the calibration circuit 110.

As shown in FIG. 24, the calibration circuit 110 is provided with a pull up unit PUR, which is a replica of the pull up unit PU, and pull down units PDR0 to PDR5, which are replicas of the pull down units PD. The pull up unit PUR has substantially the same circuit configuration as that of the pull up unit PU, and the impedance thereof is controlled by the code signal CODEPU. Similarly, all of the pull down units PDR0 to PDR5 have substantially the same circuit configurations as those of the pull down units PD, and the impedance thereof is controlled by the code signals CODEPD.

As shown in FIG. 24, output nodes of the pull down units PDR1 to PUR5 are commonly connected to the calibration terminal ZQ and are connected to a comparator COMPD. In response to activation of the calibration control signal ZQACT, the comparator COMPD compares the potential of the calibration terminal ZQ and the reference potential VREFDQ and, based on the result thereof, generates an up/down signal UDD. The up/down signal UDD is supplied to a counter CNTD, and, based on that, the code signal CODEPD, which is the count value of the counter CNTD, is incremented or decremented. The increment or decrement of the counter CNTD is carried out in synchronization with an update signal UPDATED. On the condition that the calibration control signal ZQACT is activated, the update signal UPDATED is generated by a timing generator TMD in synchronization with an oscillator signal OSCCLK. The oscillator signal OSCCLK is generated by an oscillator OSC, which is activated by the calibration control signal ZQACT. The oscillator OSC is deactivated by the calibration end signal CALEND.

Furthermore, the output nodes of the pull up unit PUR and the pull down unit PDR0 are connected to a connection node A. The connection node A is connected to a comparator COMPU. In response to activation of the calibration control signal ZQACT, the comparator COMPU compares the potential of the connection node A and the reference potential VOH and, based on the result thereof, generates an up/down signal UDU. The up/down signal UDU is supplied to a counter CNTU, and, based on that, the code signal CODEPU, which is the count value of the counter CNTU, is incremented or decremented. The increment or decrement of the counter CNTU is carried out in synchronization with an update signal UPDATEU. On the condition that the calibration control signal ZQACT and a pull-down end signal ENDPD are activated, the update signal UPDATEU is generated by a timing generator TMU in synchronization with the oscillator signal OSCCLK.

The calibration operation using the calibration circuit 110 is carried out by the below procedure.

First, when the calibration control signal ZQACT is activated, the comparator COMPD is activated, and comparison between the potential of the calibration terminal ZQ and the reference potential VREFDQ is carried out. As a result, if the potential of the calibration terminal ZQ is lower than the reference potential VREFDQ, the counter CNTD is decremented by using the up/down signal UDD, and the value of the code signal CODEPD is reduced. As a result, the impedance of the pull down units PDR1 to PDR5 is increased; therefore, the potential of the calibration terminal ZQ is increased. Reversely, if the potential of the calibration terminal ZQ is higher than the reference potential VREFDQ, the counter CNTD is incremented by using the up/down signal UDD, and the value of the code signal CODEPD is increased. As a result, the impedance of the pull down units PDR1 to PDR5 is reduced; therefore, the potential of the calibration terminal ZQ is reduced.

When such an operation is executed every time the update signal UPDATED is activated, the potential of the calibration terminal ZQ becomes the state that approximately matches the reference potential VREFDQ. Herein, the level of the reference potential VREFDQ is, for example, VDDQ/6, and the five pull down units PDR1 to PDR5 are parallely connected to the calibration terminal ZQ; therefore, when the potential of the calibration terminal ZQ becomes the state that approximately matches the reference potential VREFDQ, all of the pull down units PDR1 to PDR5 are also adjusted to the same resistance value (RZQ) as that of the reference resistor RZQ. The impedance of the pull down unit PDR0 is also adjusted to RZQ.

When the calibration operation of the pull down units PDR1 to PDR5 is completed, the pull-down end signal ENDPD is output from the counter CNTD and, subsequently, the calibration operation of the pull up unit PUR is started.

When the pull-down end signal ENDPD is activated, the comparator COMPU is activated, and comparison between the potential of the connection node A and the reference potential VOH is carried out. As a result, if the potential of the connection node A is higher than the reference potential VOH, the counter CNTU is decremented by using the up/down signal UDU, and the value of the code signal CODEPD is reduced. As a result, the impedance of the pull up unit PUR is increased; therefore, the potential of the connection node A is reduced. Reversely, if the potential of the connection node A is lower than the reference potential VOH, the counter CNTU is incremented by using the up/down signal UDU, and the value of the code signal CODEPU is increased. As a result, the impedance of the pull up unit PUR is reduced; therefore, the potential of the connection node A is increased.

When such an operation is executed every time the update signal UPDATEU is activated, the potential of the connection node A becomes the state that approximately matches the reference potential VOH. Herein, the level of the reference potential VOH is, for example, VDDQ/3, and the impedance of the pull down unit PDR0 has already been adjusted to RZQ; therefore, when the potential of the connection node A becomes the state that approximately matches the reference potential VOH, the pull up unit PUR is adjusted to the resistance value (2RZQ) that is two times that of the reference resistor RZQ.

When the calibration operation of the pull up unit PUR is completed, the calibration end signal CALEND is output from the counter CNTU, and the operation of the oscillator OSU is stopped. As a result, the series of calibration operations is completed. Then, the code signals CODEPU and CODEPD (adjustment codes CALCODE) generated by the calibration operations are supplied to the multiplexer 130 shown in FIG. 11.

Figure 25:
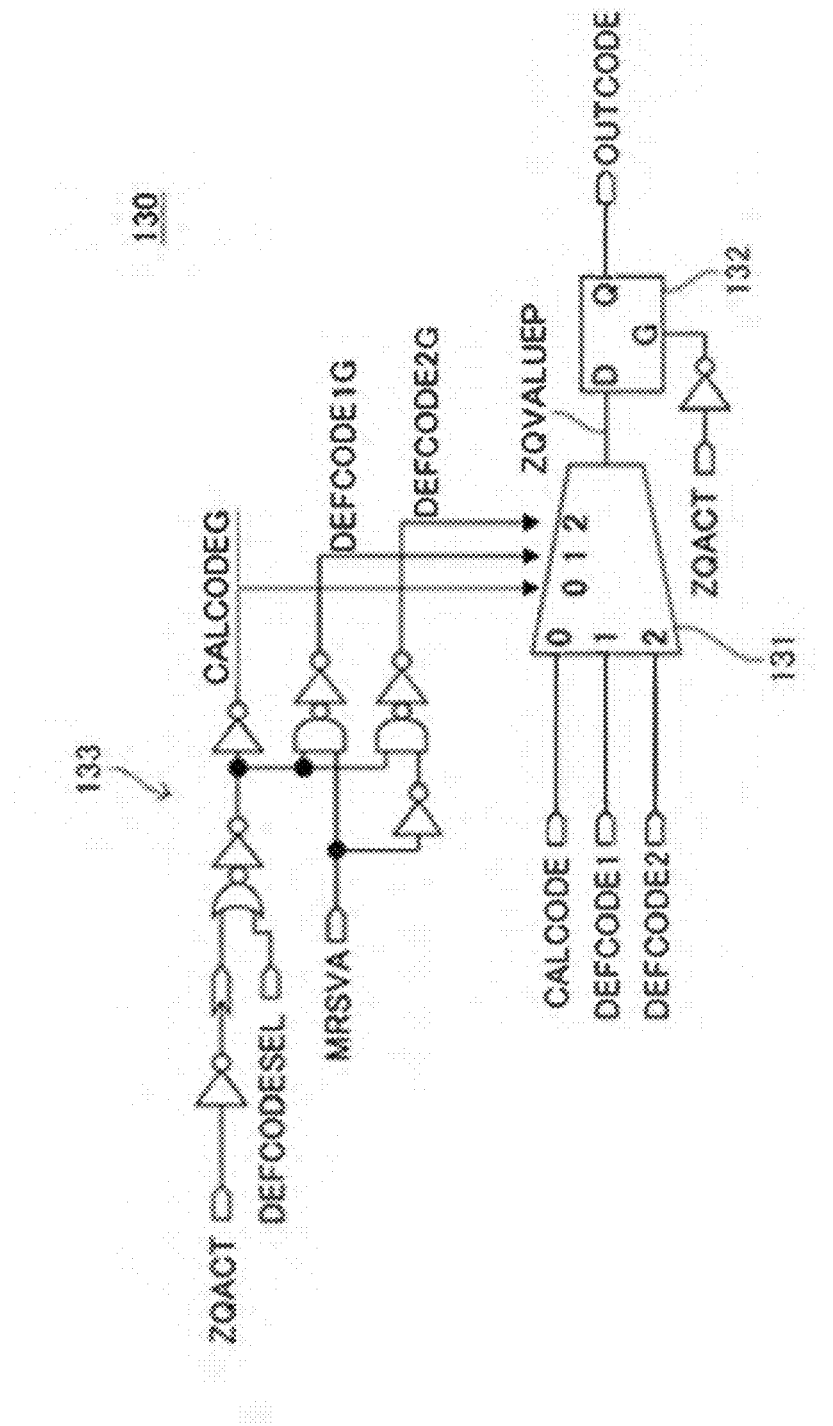
FIG. 25 is a circuit diagram of a multiplexer 130.

FIG. 25 is a circuit diagram of the multiplexer 130.

As shown in FIG. 25, the multiplexer 130 is provided with a selector 131 and a latch circuit 132. The selector 131 is provided with three input nodes 0, 1, and 2 and three select nodes 0, 1, and 2 and outputs the signal of the input node corresponding to the activated select node. The adjustment code CALCODE supplied from the calibration circuit 110 is input to the input node 0. The default codes DEFCODE1 and DEFCODE2 supplied from the code registers 121 and 122 shown in FIG. 11 are input to the input nodes 1 and 2, respectively. The default code DEFCODE1 is the initial value of the adjustment code CALCODE in the case in which the first operation mode is selected. The default code DEFCODE2 is the initial value of the adjustment code CALCODE in the case in which the second operation mode is selected.

An adjustment code ZQVALUEP output from the selector 131 is output via the latch circuit 132 and transferred to the relay circuits 300A and 300B. In FIG. 23, the output signal of the latch circuit 132 is described as the adjustment code OUTCODE.

Figure 26:
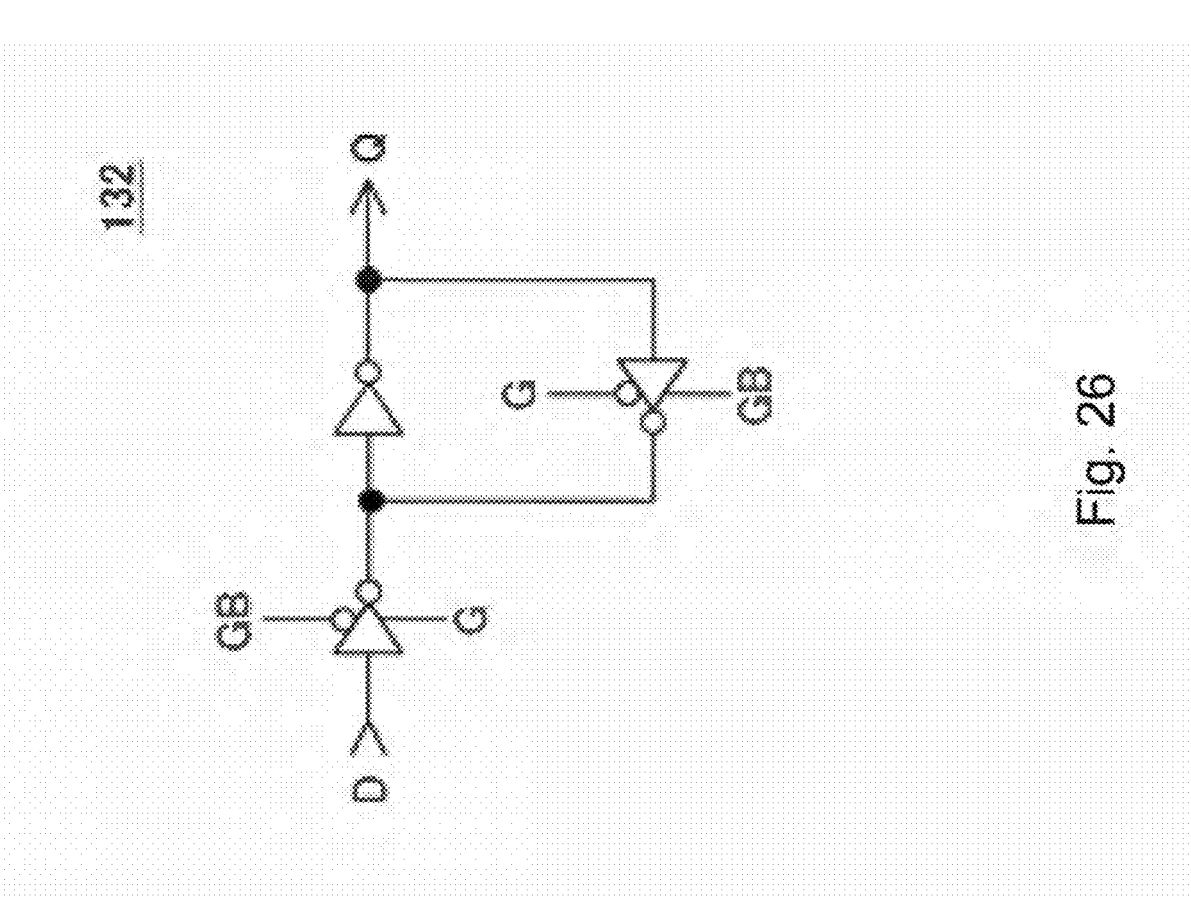
FIG. 26 is a circuit diagram of a latch circuit 132.

FIG. 26 is a circuit diagram of the latch circuit 132. As is clear from the circuit configuration shown in FIG. 26, if a select node G is at the high level, the latch circuit 132 outputs the signal which is input to an input node D to the an output node Q with no change. On the other hand, if the select node G is at the low level, the input node D and the output node Q are disconnected from each other, and the signal which has been input immediately before is output from the output node Q.

As shown in FIG. 25, the inverted signal of the calibration control signal ZQACT is input to the select node G. Therefore, during the period in which the calibration control signal ZQACT is activated to the high level, the select node G becomes the low level, and the input node D and the output node Q are therefore disconnected from each other. As a result, although the value of the adjustment code CALCODE (in other words, the adjustment code ZQVALUEP) is changed from moment to moment in synchronization with the oscillator signal OSCCLK during the calibration operation, this is not directly transferred to the relay circuits 300A and 300B. As described above, since the line connecting the code generator 100 and the relay circuit 300B is a long-distance line, the charge/discharge current thereof is large; however, since the level of the long-distance line is not changed during the calibration operation, increase in the consumed current can be prevented.

Then, when the calibration control signal ZQACT is changed to the low level because of termination of the calibration operation, the value of the adjustment code ZQVALUEP is reflected to the adjustment code OUTCODE and is transferred to the relay circuits 300A and 300B.

The signals input to the select nodes 0, 1, and 2 of the selector 131 are generated by a logic circuit 133. First, if a default select signal DEFCODESEL is deactivated to the low level, a select signal CALCODEG is activated in response to the calibration control signal ZQACT. As a result, the adjustment code CALCODE generated by the calibration circuit 110 is selected.

On the other hand, if the default select signal DEFCODESEL is deactivated to the low level, a select signal DEFCODE1G or DEFCODE2G is activated in response to the output-level select signal MRSVA. Specifically, in a case in which the output-level select signal MRSVA is at the high level and the first operation mode is selected, the select signal DEECODE1G is activated, and, as a result, the default code DEFCODE1 supplied from the code resister 121 is selected. On the other hand, in a case in which the output-level select signal MRSVA is at the low level and the second operation mode is selected, the select signal DEFCODE2G is activated, and, as a result, the default code DEFCODE2 supplied from the code register 122 is selected.

The default select signal DEFCODESEL is activated when the code generator 100 is reset, and the default select signal DEFCODESEL is deactivated when the calibration operation is started thereafter. Therefore, during the period until the calibration operation is started after the code generator 100 is reset, the delimit code DEFCODE1 or DEFCODE2 is supplied to the relay circuits 300A and 300B.

Figure 27:
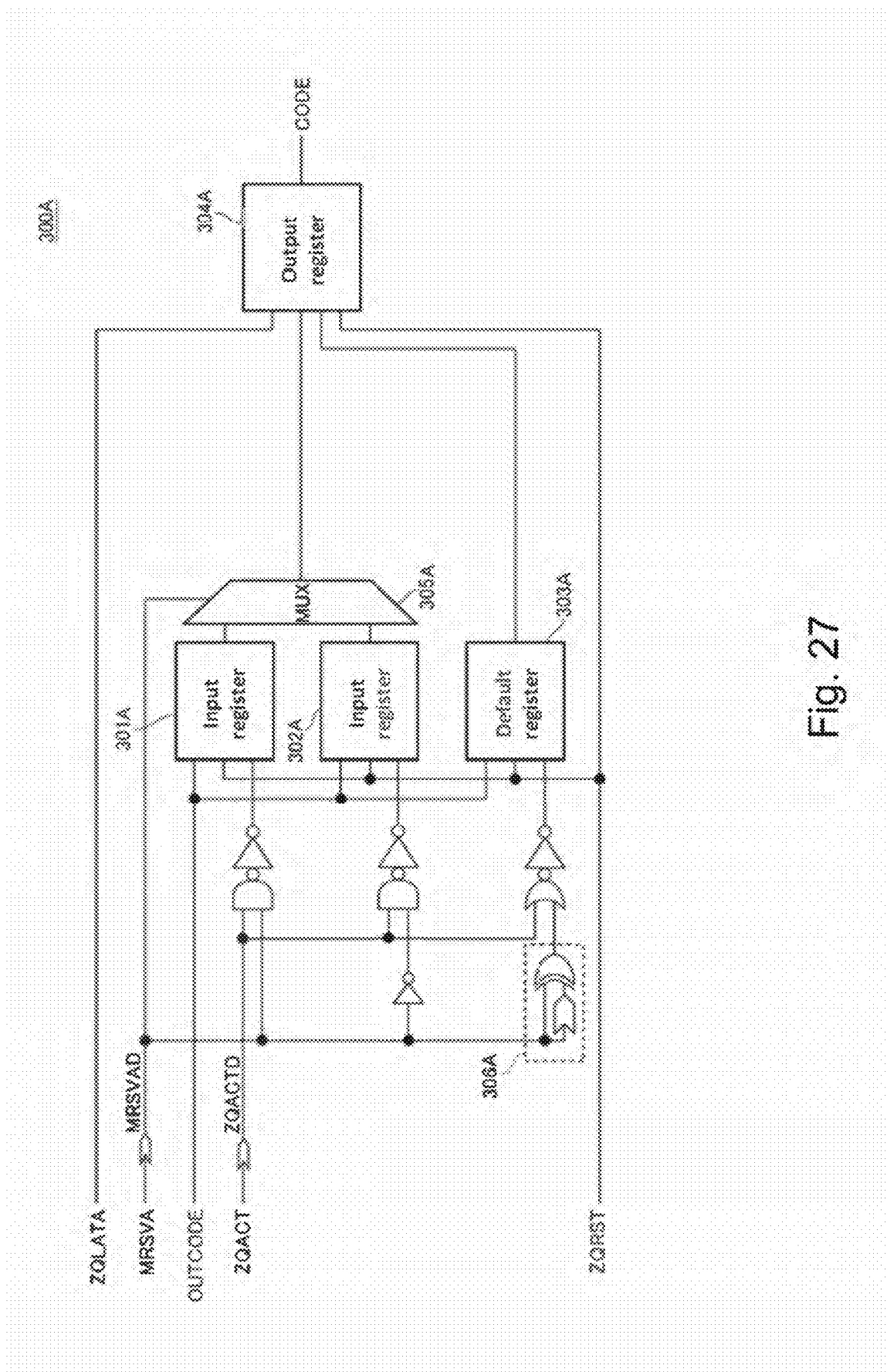
FIG. 27 is a block diagram showing a configuration of a relay circuit 300A.

FIG. 27 is a block diagram showing a configuration of the relay circuit 300A.

As shown in FIG. 27, the relay circuit 300A is provided with the input registers 301A and 302A, the default register 303A, and the output register 304A. The input registers 301A and 302A and the default register 303A latch the adjustment code OUTCODE (CALCODE, DEFCODE1 or DEFCODE2) transferred from the code generator 100. Specifically, in a case in which the output-level select signal MRSVA is at the high level and the first mode is selected, the adjustment code OUTCODE is latched by the input register 301A in response to the calibration control signal ZQACT. On the other hand, if the output-level select signal MRSVA is at the low level and the second operation mode is selected, the adjustment code OUTCODE is latched by the input register 302A in response to the calibration control signal ZQACT. If the output-level select signal MRSVA is changed, this change is detected by a detector 306A. In this case, the adjustment code OUTCODE is latched by the default register 303A in response to the calibration control signal ZQACT.

However, in selection of the registers, in order to adjust the operation timing, an output-level select signal MRSVAD obtained by delaying the output-level select signal MRSVA is used, and a calibration control signal ZQACTD obtained by delaying the calibration control signal ZQACT is used.

The adjustment codes OUTCODE latched by the input registers 301A and 302A are supplied to the output register 304A via a multiplexer 305A. If the output-level select signal MRSVAD is indicating the first operation mode, the multiplexer 305A selects the adjustment code OUTCODE output from the input register 301A. If the output-level select signal MRSVAD is indicating the second operation mode, the multiplexer 305A selects the adjustment code OUTCODE output from the input register 302A.

In response to activation of the code update signal ZQLATA, the output register 304A latches the input adjustment code OUTCODE (CALCODE, DEFCODE1 or DEF-CODE2). The adjustment code CODE latched by the output register 304A is supplied to the data output circuit 41A, and, as a result, the output impedance of the data output circuit 41A is adjusted. Therefore, after the calibration operation is completed, in response to activation of the code update signal ZQLATA, the updated adjustment code CODE is supplied to the data output circuit 41A.

Figure 28:
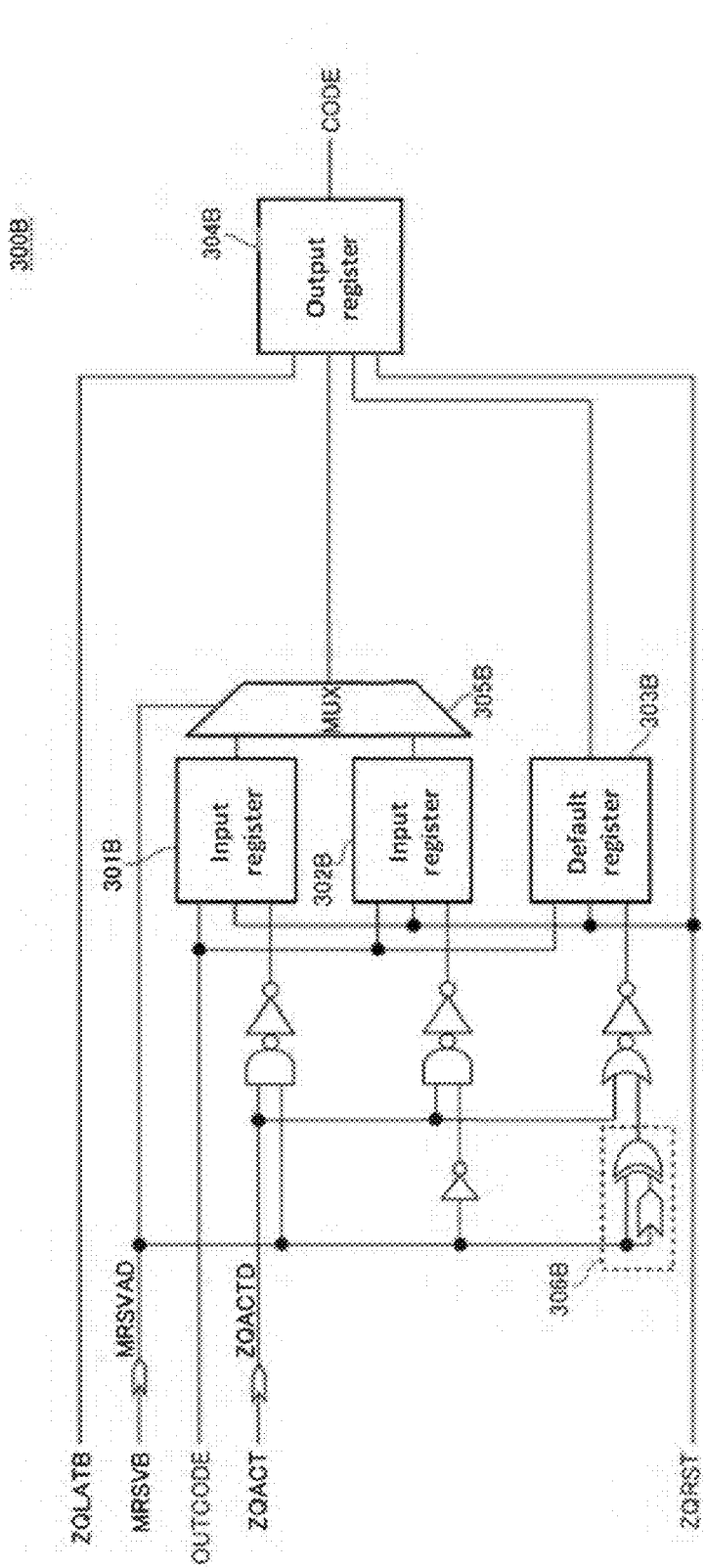
FIG. 28 is a block diagram showing a configuration of a relay circuit 300B.

FIG. 28 is a block diagram showing a configuration of the relay circuit 300B.

As shown in FIG. 28, the relay circuit 300B is provided with the input registers 301B and 302B, the default register 303B, the output register 304B, a multiplexer 305B, and a detector 306B. Except that the code update signal ZQLATB is used instead of the code update signal ZQLATA, the operation of the relay circuit 300B is the same as the above described operation of relay circuit 300A. Therefore, redundant explanations are omitted.

Therefore, when the code update signal ZQLATB is activated after the calibration operation is completed, the updated adjustment code CODE is supplied to the data output circuit 41B.

Figure 29:
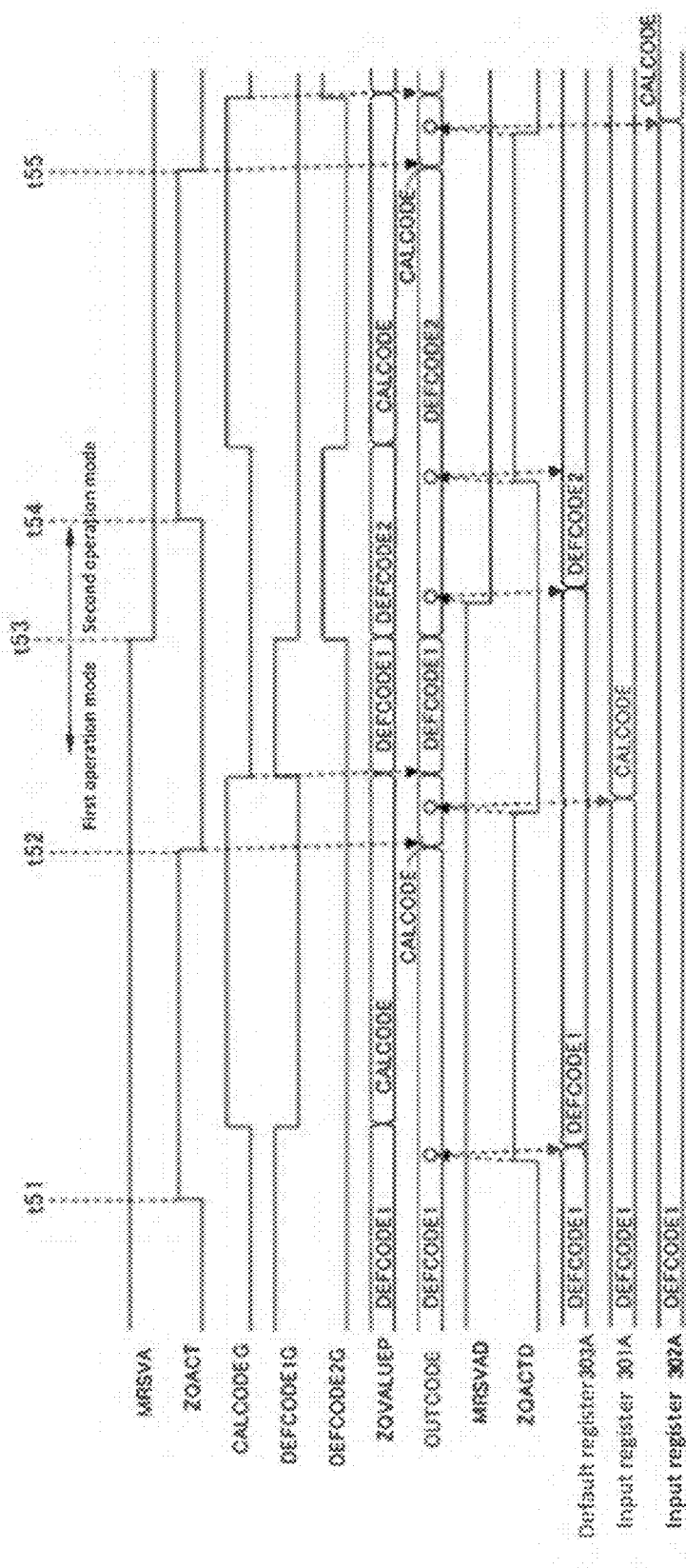
FIG. 29 is a timing chart for explaining operations of the multiplexer 130 and the relay circuit 300A.

FIG. 29 is a timing chart for explaining the operations of the multiplexer 130 and the relay circuit 300A.

In the example shown in FIG. 29, at time t53, the output-level select signal MRSVA is changed from the high level to the low level. Therefore, the first operation mode is specified before the time t53, and the second operation mode is specified after the time t53. In the period in which the first operation mode is specified, the calibration control signal ZQACT is changed to the high level at time t51, and, then, the calibration control signal ZQACT is changed to the low level at time t52. In the period in which the second operation mode is specified, the calibration control signal ZQACT is changed to the high level at time t54, and, then, the calibration control signal ZQACT is changed to the low level at time t55.

When the calibration control signal ZQACT is changed to the high level at the time t51, after predetermined delay time elapses, the select signal CALCODEG becomes the high level. Since the selector 131 selects the input node 0 as a result, the adjustment code ZQVALUEP output from the selector 131 becomes the adjustment code CALCODE generated by the calibration circuit 110. However, since the calibration control signal ZQACT is at the high level at this point of time, the adjustment code OUTCODE output from the latch circuit 132 is indicating the default code DEFCODE1.

In the period in which the calibration control signal ZQACT is at the high level, the calibration operation is executed by the calibration circuit 110. In the present example, since the first operation mode is selected in this case, the calibration operation is carried out by setting the level of the reference potential VREFDQ to VDD/6 and setting the level of the reference potential VOH to VDD/3.

If the delayed calibration control signal ZQACTD is changed to the high level, the default registers 303A and 303B carry out latch operations. As a result, in the default register 303A, the default code DEFCODE1 is latched.

Then, when the calibration control signal ZQACT is changed to the low level at the time t52, the adjustment code OUTCODE output from the latch circuit 132 is switched from the default code DEFCODE1 to the adjustment code CALCODE. As a result, the adjustment code CALCODE is transferred to the relay circuits 300A and 300B. Then, when the delayed calibration control signal ZQACTD is changed to the low level, the input registers 301A and 301B carry out latch operations. As a result, in the input registers 301A and 301B, the adjustment code CALCODE is latched.

Then, the select signal DEFCODE1G becomes the high level, and the state returns to the state before the time t51.

Then, when the output-level select signal MRSVA is changed at the time t53, the select signal DEFCODE2G becomes the high level instead of the select signal DEECODE1G. As a result, the adjustment code ZQVAL-UEP output from the selector 131 is changed to the default code DEFCODE2, and this is output as the adjustment code OUTCODE with no change via the latch circuit 132.

When the delayed output-level select signal MRSVA is changed to the high level, the default register 303A contained in the relay circuit 300A carries out a latch operation. As a result, in the default registers 303A and 303B, the default code DEFCODE2 is latched.

Then, when the calibration control signal ZQACT is changed to the high level at the time t54, after predetermined delay time elapses, the select signal CALCODEG becomes the high level. As a result, the selector 131 selects the input node 0. Therefore, the adjustment code ZQVALUEP output from the selector 131 becomes the adjustment code CAL-CODE, which is generated by the calibration circuit 110. However, since the calibration control signal ZQACT is at the high level at this point of time, the adjustment code OUTCODE output from the latch circuit 132 indicates the default code DEFCODE2.

In the period in which the calibration control signal ZQACT is at the high level, the calibration operation is executed by the calibration circuit 110. In the present example, since the second operation mode is selected at this point, the calibration operation is carried out while setting the level of the reference potential VREFDQ to VDD/5 and setting the level of the reference potential VOH to VDD/2.5.

When the delayed calibration signal ZQACTD is changed to the high level, the default register 303A contained in the relay circuit 300A carries out the latch operation. As a result, in the default registers 303A and 303B, the default code DEFCODE2 is latched.

Then, when the calibration control signal ZQACT is changed to the low level at the time t55, the adjustment code OUTCODE output from the latch circuit 132 is switched from the default code DEFCODE2 to the adjustment code CALCODE. As a result, the adjustment code CALCODE is transferred to the relay circuits 300A and 300B. Then, when the delayed calibration control signal ZQACTD is changed to the low level, the input registers 302A and 302B carry out latch operations. As a result, in the input registers 302A and 302B, the adjustment code CALCODE is latched.

Then, the select signal DEFCODE2G becomes the high level, and the state returns to the state before the time t54.

In this manner, in the present embodiment, since the default registers 303A and 303B are provided in the relay circuits 300A and 300B, even immediately after the code generator 100 is reset, the default code DEFCODE1 or DEFCODE2 can be immediately supplied to the data output circuits 41A and 41B. Moreover, since the input registers 301A and 301B for the first operation mode and the input registers 302A and 302B for the second operation mode are provided in the relay circuits 300A and 300B, even when the operation mode is switched, the adjustment code CALCODE obtained by calibrating in the previous operation mode is saved.

FIG. 30 shows an example of changes of the adjustment codes retained in the registers.

First, at time t61 in the initial state after power-on, the first operation mode is selected. Then, by an initialization operation, the default code DEFCODE1 is stored in the code register 121, and the default code DEFCODE2 is stored in the code register 122. The default code DEFCODE1 is transferred to all of the other registers contained in the code generator 100 and the relay circuits 300A and 300B. As a result, the data output circuits 41A and 41B are set to the output impedance specified by the default code DEFCODE1.

Then, when the first operation mode is switched to the second operation mode by issuing the mode-register set command at time t62, the default code DEFCODE2 retained in the code register 122 is transferred to the default registers 303A and 303B and is further transferred to the output registers 304A and 304B. As a result, the data output circuits 41A and 41B are set to the output impedance specified by the default code DEFCODE2.

Then, when the calibration command is issued at time t63, the calibration circuit 110 executes the calibration operation and generates the adjustment code CALCODE. Then, when the calibration operation is completed, the adjustment code CALCODE is transferred to the relay circuits 300A and 300B and are retained in the input registers 302A and 302B. At this point of time, the output impedance of the data output circuits 41A and 41B is the output impedance specified by the default code DEFCODE2.

Furthermore, when the code update command is issued at time t64, the adjustment code CALCODE retained in the input registers 302A and 302B is transferred to the output registers 304A and 304B. As a result, the data output circuits 41A and 41B are set to the output impedance specified by the adjustment code CALCODE obtained by the calibration operation.

Then, when the reset command is issued at time t65, all of the code generator 100 is reset and becomes the state which is the same as that at the time t61 is obtained. On the other hand, the input registers 301A, 302A, 301B, and 302B, and the default registers 303A and 303B contained in the relay circuits 300A and 300B are not reset, and the default code DEFCODE2 retained in the default registers 303A and 303B is transferred to the output registers 304A and 304B. As a result, even after reset, the data output circuits 41A and 41B are immediately set to the output impedance specified by the default code DEFCODE2.

Then, when the second operation mode is switched to the first operation mode by issuing of the mode-register-set command at time t66, the default code DEFCODE1 retained in the code register 121 is transferred to the default registers 303A and 303B and is further transferred to the output registers 304A and 304B. As a result, the data output circuits 41A and 41B are set to the output impedance specified by the default code DEFCODE1.

As explained above, since the semiconductor device 10 according to the present embodiment is provided with the arbiter 200, which carries out arbitration of the calibration execution signals ZQEXEA and ZQEXEB, which are mutually asynchronously generated. Therefore, the calibration operation can be normally executed even when the calibration execution signals ZQEXEA and ZQEXEB are generated at any timing.

Moreover, after the value of the adjustment code CALCODE is determined by the calibration operation, the value-determined adjustment code CALCODE is transferred to the relay circuits 300A and 300B. Therefore, increase in the consumed current caused by variations in the value of the adjustment code CALCODE in the calibration operation can be suppressed.

Furthermore, since the code registers 121 and 122, which store the default codes DEFCODE1 and DEFCODE2, are provided in the code generator 100, even immediately after reset or immediately after switching of the operation modes, the default code DEFCODE1 or DEFCODE2 can be immediately supplied to the data output circuits 41A and 41B.

The code registers 121 and 122 may be disposed in the side of the relay circuits 300A and 300B. In that case, the default registers 303A and 303B may be removed from the relay circuits 300A and 300B, and the code registers 121 and 122 may be provided instead of them. An example of changes of the adjustment code retained in the registers in this case is shown in FIG. 31.

Figure 31:
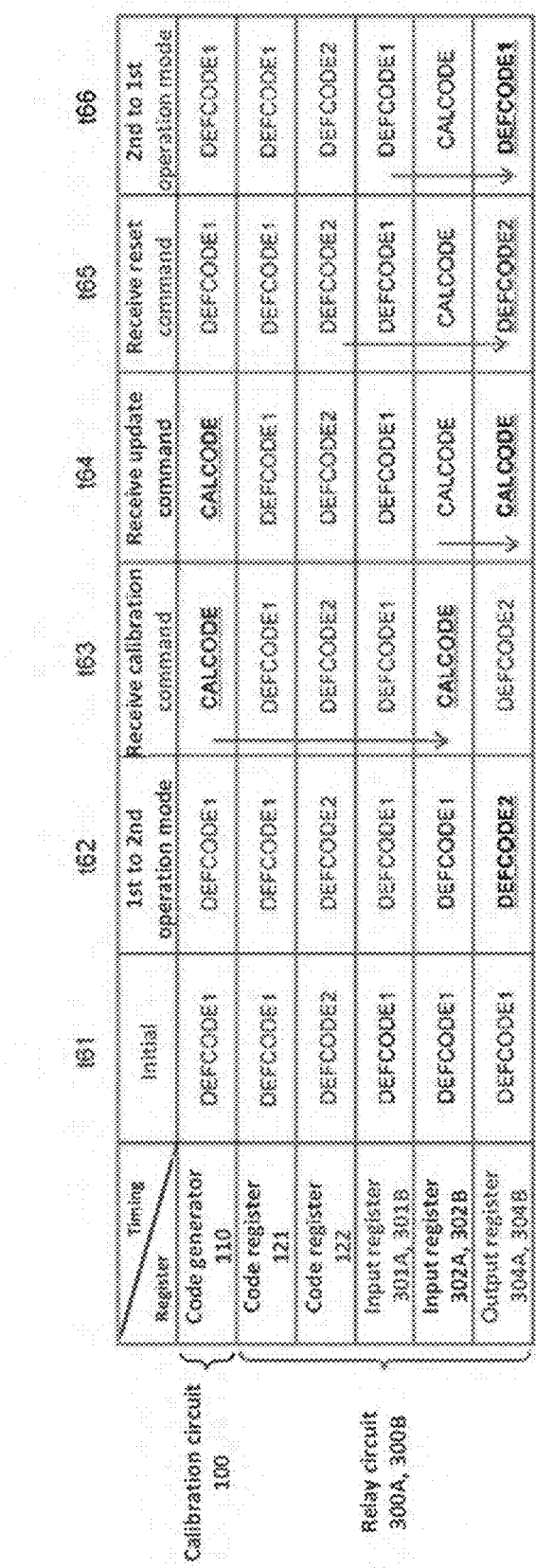
FIG. 31 is a drawing showing another example of changes of the adjustment codes retained in the registers.

As shown in FIG. 31, in the present example, when the first operation mode is switched to the second operation mode (time t61), the default code DEFCODE2 is transferred from the code registers 122 in the relay circuits 300A and 300B to the output registers 304A and 304B. Similarly, when the reset command is issued (time t65), the default code DEFCODE2 is transferred from the code registers 122 in the relay circuits 300A and 300B to the output registers 304A and 304B. Then, when the second operation mode is switched to the first operation, mode (time t66), the default code DEFCODE1 is transferred from the input registers 301A and 301B in the relay circuits 300A and 300B to the output registers 304A and 304B. Other operations are basically the same as the operations shown in FIG. 30.

Figure 32:
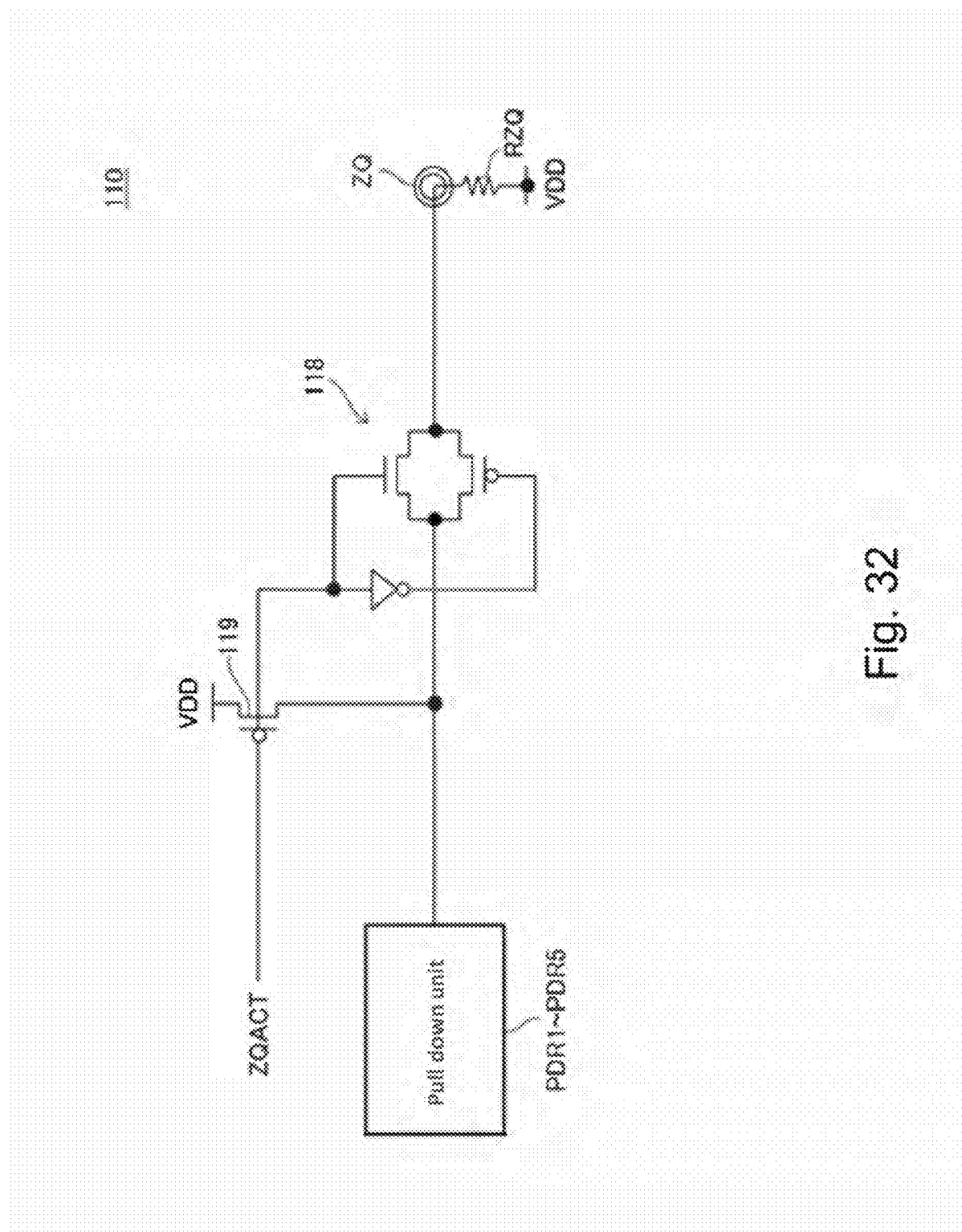
FIG. 32 is a circuit diagram showing part of the calibration circuit 110 according to a modification example.

FIG. 32 is a circuit diagram showing part of the calibration circuit 110 according to a modification example.

FIG. 32 shows only the circuit which is provided between the calibration terminal ZQ and the pull down units PDR1 to PDR5 in the calibration circuit 110 according to the modification example. Since the other circuit part is the same as that shown in FIG. 24, illustration is omitted.

As shown in FIG. 32, the calibration circuit 110 according to the modification example is provided with a transfer gate 118 between the calibration terminal ZQ and the pull down units PDR1 to PDR5 and has a transistor 119, which fixes the output nodes of the pull down units PDR1 to PDR5 to the power-source potential VDD. Then, when the calibration control signal ZQA is activated to the high level, the transfer gate 118 is turned on; therefore, the calibration operation is enabled. On the other hand, the transfer gate 118 is turned off in the period in which the calibration control signal ZQACT is at the low level; therefore, the calibration terminal ZQ and the pull down units PDR1 to PDR5 are disconnected, and the output nodes of the pull down units PDR1 to PDR5 are fixed to the power-source potential VDD. By virtue of this, even when the reference resistor RZQ is shared by a plurality of chips, only the transfer gate 118 of the chip which carries out the calibration operation is turned on; therefore, the internal circuit of the chip(s) which does not carry out the calibration operation does not become the load capacity of the calibration terminal ZQ, the load capacity in the calibration operation, specifically, the load capacity in a comparison operation of the comparator CMPD becomes constant, and the stable calibration operation can be ensured.

Figure 33:
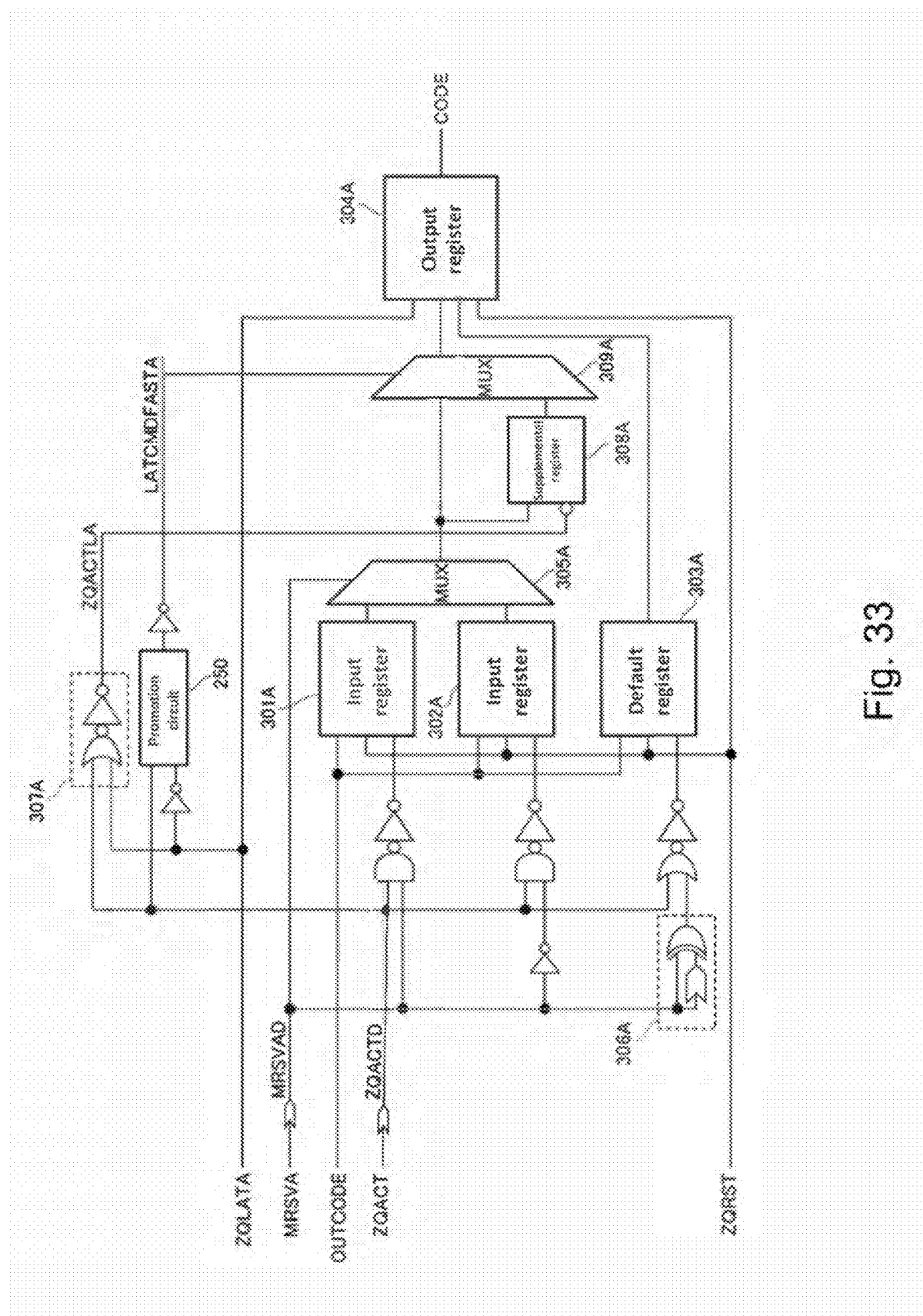
FIG. 33 is a block diagram showing a configuration of the relay circuit 300A according to a modification example.

FIG. 33 is a block diagram showing a configuration of the relay circuit 300A according to a modification example.

The relay circuit 300A according to the modification example is different from the relay circuit 300A shown in FIG. 27 in the point that the promotion circuit 250, an OR circuit 307A, a supplemental register 308A, and a multiplexer 309A are added as shown in FIG. 33. Since the other configurations are basically the same as those of the relay circuit 300A shown in FIG. 27, the same elements are denoted by the same symbols, and redundant explanations are omitted. When the present modification example is used, the circuit configuration according to FIG. 32 can be employed also for the relay circuit 300B.

In addition to the function of the relay circuit 300A shown in FIG. 27, the relay circuit 300A according to the modification example has a function to correctly output the adjustment code CODE even when the difference between the end timing of the calibration operation and the activation timing of the code update signal ZQLATA is small. Specifically, it has the function to, when the code update signal ZQLATA is activated immediately before the calibration operation is terminated, output the previous adjustment code CODE instead of the adjustment code CODE generated by the current calibration operation. On the other hand, if the code update signal ZQLATA is activated after the calibration operation is terminated, the adjustment code CODE generated by the current calibration operation is output.

As shown in FIG. 33, the OR circuit 307A receives the delayed calibration control signal ZQACTD and the code update signal ZQLATA and generates a code update signal ZQACTLA. Therefore, if at least one of the delayed calibration control signal ZQACTD and the code update signal ZQLATA is at the high level, the code update signal ZQACTLA maintains the high level. This means that, when the code update signal ZQLATA is activated immediately before the calibration operation is terminated, the code update signal ZQACTLA maintains the high level. On the other hand, in a case in which the code update signal ZQLATA is activated after the calibration operation is terminated, the code update signal ZQACTLA is once changed to the low level. The code update signal ZQACTLA is input to the supplemental register 308A.

The promotion circuit 250 is the circuit shown in FIG. 18. The delayed calibration control signal ZQACTD and the inverted code update signal ZQLATA are input to the promotion circuit 250, and the promotion circuit 250 has the circuit configuration which prioritizes the delayed calibration control signal ZQACTD. As a result, if the decay of the delayed calibration control signal ZQACTD is faster than the rise of the code update signal ZQLATA, a select signal LATCMDFASTA is maintained at the low level; and, if the rise of the code update signal ZQLATA is faster than the decay of the delayed calibration control signal ZQACTD, the select signal LATCMDFASTA becomes the high level.

Then, since the promotion circuit 250 has the circuit configuration which priorities the delayed calibration control signal ZQACTD, if the timing of both of them is overlapped, the select signal LATCMDFASTA becomes the low level.

The select signal LATCMDFASTA is input to the multiplexer 309A. If the select signal LATCMDFASTA is at the low level, the multiplexer 309A selects output of the multiplexer 305A. If the select signal LATCMDFASTA is at the high level, the multiplexer 309A selects output of the supplemental register 308A. The supplemental register 308A is a circuit which outputs the input signal with no change by allowing the signal to go therethrough if the code update signal ZQLATLA is at the low level and latches the input signal if the code update signal ZQLATLA is changed to the high level.

By virtue of the above configuration, when the select signal LATCMDFASTA is changed to the high level, the output of the supplemental register 308A is selected instead of the output of the multiplexer 305A. Therefore, the previous value can be output with no change as the adjustment code CODE. Thus, the output of the multiplexer 305A is not selected at the timing when the value is changed. Moreover, since the metastable time of the promotion circuit 250 per se is short, safety of the circuit operations is improved.

When the information of the signals GETA and GETB of FIG. 13 is output to outside of the semiconductor device 10, a user of the semiconductor device 10 can judge the state thereof by using this information, and more reliable arbitration operations can be carried out. Thus, according to this information, the user can distinguish whether the current computation result is according to the instructions by the user or according to someone else. In addition, in the semiconductor device 10 according to the present embodiment, while a certain user has an exclusive right, the user can reliably occupy a computing device. Therefore, if a sequence "keep requesting until you obtain an exclusive right; and, after you obtain the exclusive right, extract computation results after certain time, and obtain the values" is repeated with respect to the semiconductor device of the configuration of the present invention, the user who uses the computing device can reliably obtain desired calculation results. In this manner, users who share computing elements in the semiconductor device can equally use the computing elements.

Hereinabove, the preferred embodiment of the present invention has been explained. However, the present invention is not limited to the above described embodiment, various modifications can be made within the range not departing from the gist of the present invention, and it goes without saying that they are also included in the range of the present invention.

What is claimed is:

1. A method for calibrating a semiconductor device, comprising:
   receiving a first calibration command at a first set of terminals of the semiconductor device;
   performing a first calibration operation for a first output circuit of the semiconductor device responsive to the first calibration command;
   receiving a second calibration command at a second set of terminals of the semiconductor device;
   performing a second calibration operation for a second output circuit of the semiconductor device responsive to the second calibration command;
   receiving a first latch command at the first set of terminals, the first latch command is received after the first calibration operation has been finished and before the second calibration command is received; and
   applying a first calibration code produced by the first calibration operation to the first output circuit responsive to the first latch command.

2. The method of claim 1, wherein the second command is received after the first calibration operation has been finished.

3. The method of claim 1, further comprising:
   receiving a third calibration command at the first set of terminals; and
   ignoring the third command when the third command has been received while the second calibration operation is being performed.

4. The method of claim 1, further comprising:
   receiving a second latch command at the second set of terminals, the second latch command is received after the second calibration operation has been finished; and
   applying a second calibration code produced by the second calibration operation to the second output circuit responsive to the second latch command.

5. The method of claim 4, wherein the applying the first calibration code produced by the first calibration operation to the first output circuit is executed without applying the first calibration code to the second output circuit.

6. The method of claim 4, further comprising:
   receiving a second latch command at the second set of terminals, the second latch command is received after the first calibration operation has been finished and before the second calibration command is received; and
   applying the first calibration code to the second output circuit responsive to the second latch command.

7. The method of claim 1, wherein the semiconductor device is coupled to a common resistor used in each of the first and second calibration operations.

8. A method for calibrating a semiconductor device, comprising:
   receiving a first calibration command for a first output circuit of the semiconductor device;
   performing a first calibration operation responsive to the first calibration command;
   receiving a second calibration command for a second output circuit of the semiconductor device;
   ignoring the second calibration command when the second calibration command has been received while the first calibration operation is being performed;
   receiving a first latch command; and
   applying a first calibration code produced by the first calibration operation to the first output circuit responsive to the first latch command.

9. The method of claim 8, further comprising:
   receiving a third calibration command for the second output circuit; and
   performing a second calibration operation responsive to the third calibration command when the third command is received after the first calibration operation has been finished.

10. The method of claim 8, wherein the applying the first calibration code produced by the first calibration operation to the first output circuit is executed without applying the first calibration code to the second output circuit.

11. The method of claim 8, further comprising:
    receiving a second latch command; and
    applying the first calibration code to the second output circuit responsive to the second latch command.

12. The method of claim 9, wherein the semiconductor device is coupled to a common resistor used in each of the first and second calibration operations.

13. A method for calibrating a semiconductor device, comprising:
    receiving a first calibration command for a first output circuit of the semiconductor device;
    performing a first calibration operation responsive to the first calibration command to produce a first calibration code;
    receiving a first latch command to apply the first calibration code to the first output circuit; and
    receiving a second latch command to apply the first calibration code to a second output circuit of the semiconductor device.

14. The method of claim 13, further comprising:
    receiving a second calibration command for the second output circuit; and
    ignoring the second calibration command when the second calibration command has been received while the first calibration operation is being performed.

15. The method of claim 13, further comprising:
    receiving a second calibration command for the second output circuit; and
    performing a second calibration operation responsive to the second calibration command to produce a second calibration code when the second calibration command is received after the first calibration operation has been finished.

16. The method of claim 15, wherein the semiconductor device is coupled to a common resistor used in each of the first and second calibration operations.

* * * * *

UNITED STATES PATENT AND TRADEMARK OFFICE
CERTIFICATE OF CORRECTION

PATENT NO. : 10,026,457 B2
APPLICATION NO. : 15/490690
DATED : July 17, 2018
INVENTOR(S) : Tetsuya Arai et al.

Page 1 of 1

It is certified that error appears in the above-identified patent and that said Letters Patent is hereby corrected as shown below:

In the Claims

| | Reads | Should Read |
|---|---|---|
| Column 29, Line 44 In Claim 6, | "The method of claim 4," | --The method of claim 1,-- |

Signed and Sealed this
Twenty-third Day of April, 2019

Andrei Iancu
*Director of the United States Patent and Trademark Office*